(12) United States Patent
Dasgupta et al.

(10) Patent No.: US 11,552,075 B2
(45) Date of Patent: Jan. 10, 2023

(54) GROUP III-NITRIDE (III-N) DEVICES AND METHODS OF FABRICATION

(71) Applicant: Intel Corporation, Santa Clara, CA (US)

(72) Inventors: Sansaptak Dasgupta, Hillsboro, OR (US); Marko Radosavljevic, Portland, OR (US); Han Wui Then, Portland, OR (US); Paul Fischer, Portland, OR (US); Walid Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 948 days.

(21) Appl. No.: 16/147,706

(22) Filed: Sep. 29, 2018

(65) Prior Publication Data

US 2020/0105744 A1     Apr. 2, 2020

(51) Int. Cl.

| H01L 27/07 | (2006.01) |
|---|---|
| H01L 29/20 | (2006.01) |
| H01L 29/51 | (2006.01) |
| H01L 29/49 | (2006.01) |
| H01L 27/02 | (2006.01) |
| H01L 29/66 | (2006.01) |
| H01L 21/321 | (2006.01) |
| H01L 21/02 | (2006.01) |
| H01L 29/778 | (2006.01) |

(52) U.S. Cl.
CPC .... *H01L 27/0727* (2013.01); *H01L 21/02389* (2013.01); *H01L 21/3212* (2013.01); *H01L 27/0266* (2013.01); *H01L 29/2003* (2013.01); *H01L 29/4966* (2013.01); *H01L 29/517* (2013.01); *H01L 29/66553* (2013.01); *H01L 29/778* (2013.01)

(58) Field of Classification Search
None
See application file for complete search history.

(56) References Cited

U.S. PATENT DOCUMENTS

| 8,946,724 B1* | 2/2015 | Shinohara | H01L 29/201 257/104 |
|---|---|---|---|
| 2006/0255364 A1* | 11/2006 | Saxler | H01L 29/2003 257/E29.093 |
| 2008/0157121 A1* | 7/2008 | Ohki | H01L 29/66462 257/E21.403 |
| 2008/0203430 A1* | 8/2008 | Simin | H01L 29/7783 257/192 |

(Continued)

*Primary Examiner* — Bilkis Jahan
(74) *Attorney, Agent, or Firm* — Essential Patents Group, LLP

(57) ABSTRACT

A device includes a diode that includes a first group III-nitride (III-N) material and a transistor adjacent to the diode, where the transistor includes the first III-N material. The diode includes a second III-N material, a third III-N material between the first III-N material and the second III-N material, a first terminal including a metal in contact with the third III-N material, a second terminal coupled to the first terminal through the first group III-N material. The device further includes a transistor structure, adjacent to the diode structure. The transistor structure includes the first, second, and third III-N materials, a source and drain, a gate electrode and a gate dielectric between the gate electrode and each of the first, second and third III-N materials.

20 Claims, 18 Drawing Sheets

(56) References Cited

U.S. PATENT DOCUMENTS

| | | | |
|---|---|---|---|
| 2009/0045438 A1* | 2/2009 | Inoue | H01L 29/155 |
| | | | 257/E29.091 |
| 2011/0006346 A1* | 1/2011 | Ando | H01L 29/4236 |
| | | | 257/192 |
| 2013/0271208 A1* | 10/2013 | Then | H01L 25/072 |
| | | | 438/270 |
| 2016/0315204 A1* | 10/2016 | Chyi | H01L 29/2003 |

* cited by examiner

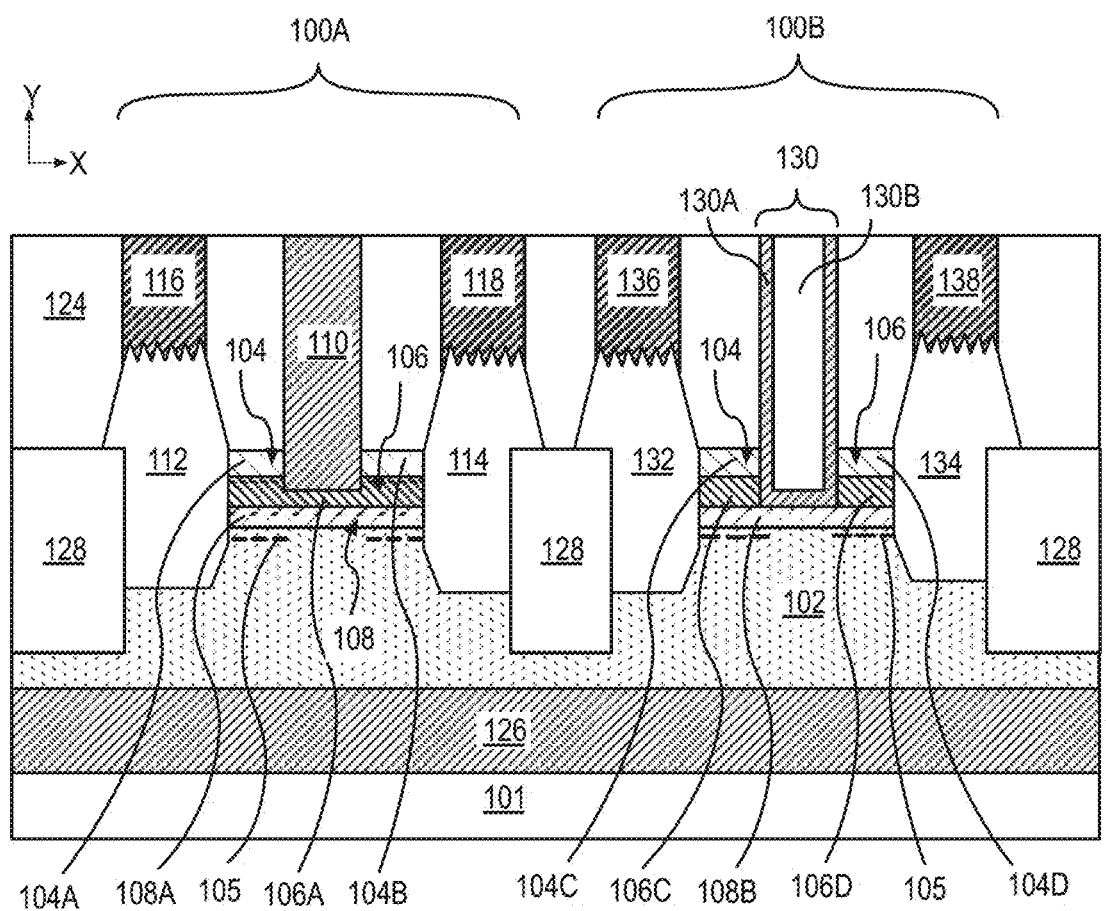
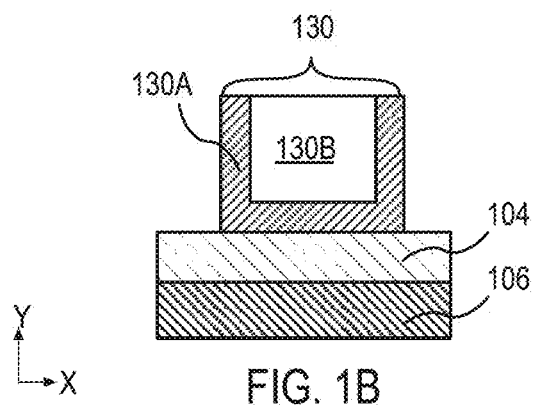 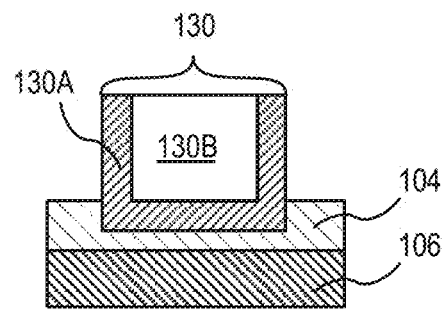
FIG. 1A
FIG. 1B          FIG. 1C

300

```
Form a group III-nitride (III-N) material above a substrate
310
           │
           ▼
Form one or more polarization layers above the III-N material
320
           │
           ▼
Form terminals on the III-N material
330
           │
           ▼
Form a gate structure above the III-N material between a second pair of
terminals
350
           │
           ▼
Form a diode terminal above the III-N material between a first pair of terminals
340
```

FIG. 3

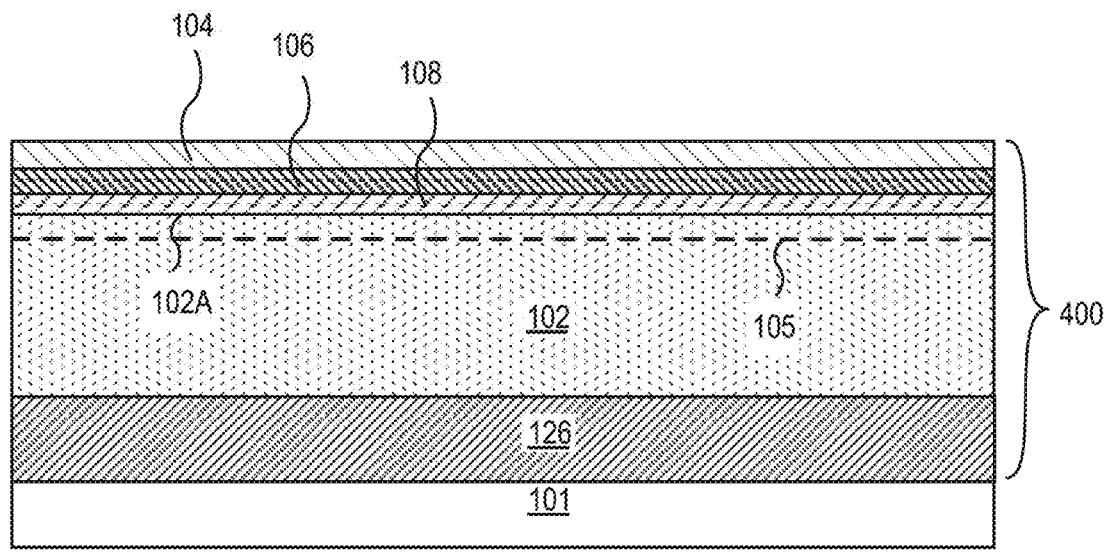
FIG. 4A
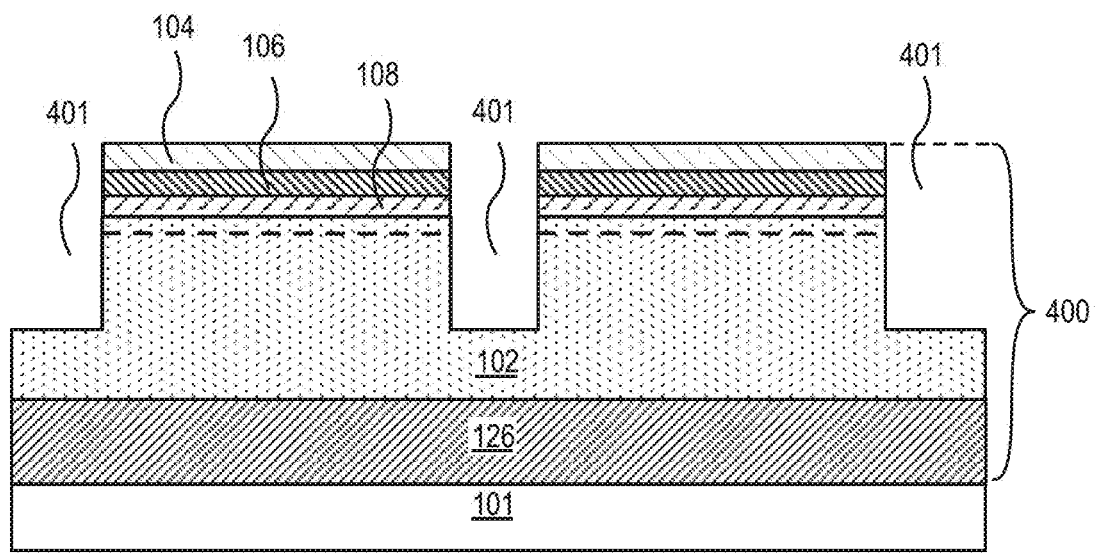
FIG. 4B

GROUP III-NITRIDE (III-N) DEVICES AND METHODS OF FABRICATION

BACKGROUND

In the fields of wireless communication and power management, various components can be implemented using solid-state devices. For example, in radio frequency (RF) communication, the RF front-end is a generic term for the circuitry between an antenna and a digital baseband system. Such RF front-end components may include one or more diodes in conjunction with one or more transistors, such as one or more field-effect transistors (FETs). Due, in part, to their large bandgap and high mobility, gallium nitride (GaN) and other III-N semiconductor materials are suited for integrated circuits for applications such as high-frequency and high-power. However, the transistor gates in particular, may be susceptible to damage from process-induced charging during a manufacturing process, and from electrostatic discharge (ESD) events that occur during packaging and during normal use. Reliable manufacturing processes that produce such integrated circuits may require some form of electrostatic discharge (ESD) protection to prevent component damage. One form of ESD protection can be obtained by fabrication of a diode connected to a transistor or multiple diodes connected to a single or multiple transistors.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1A illustrates a cross-sectional view of a device including a diode and transistor on a first III-N semiconductor material, in accordance with embodiments of the present disclosure.

FIG. 1B illustrates a cross-sectional view of a gate dielectric layer on a first polarization layer including a second III-N semiconductor material.

FIG. 1C illustrates a cross-sectional view of a gate dielectric layer in a recess in a first polarization layer.

FIG. 3 is a flow diagram of a method to fabricate the device including the diode and the group III-N transistor in FIG. 1A, in accordance with embodiments of the present disclosure.

FIG. 4A is a cross-sectional illustration of a III-N material formed above a substrate, a mobility layer formed above the III-N material and a first polarization layer and a second polarization layer formed above the mobility layer.

FIG. 4B illustrates the structure of FIG. 4A, following the formation of a plurality of recesses in a first and in the second polarization layers and in the III-N material, in accordance with an embodiment of the present disclosure.

DESCRIPTION OF THE EMBODIMENTS

Figure 1D:
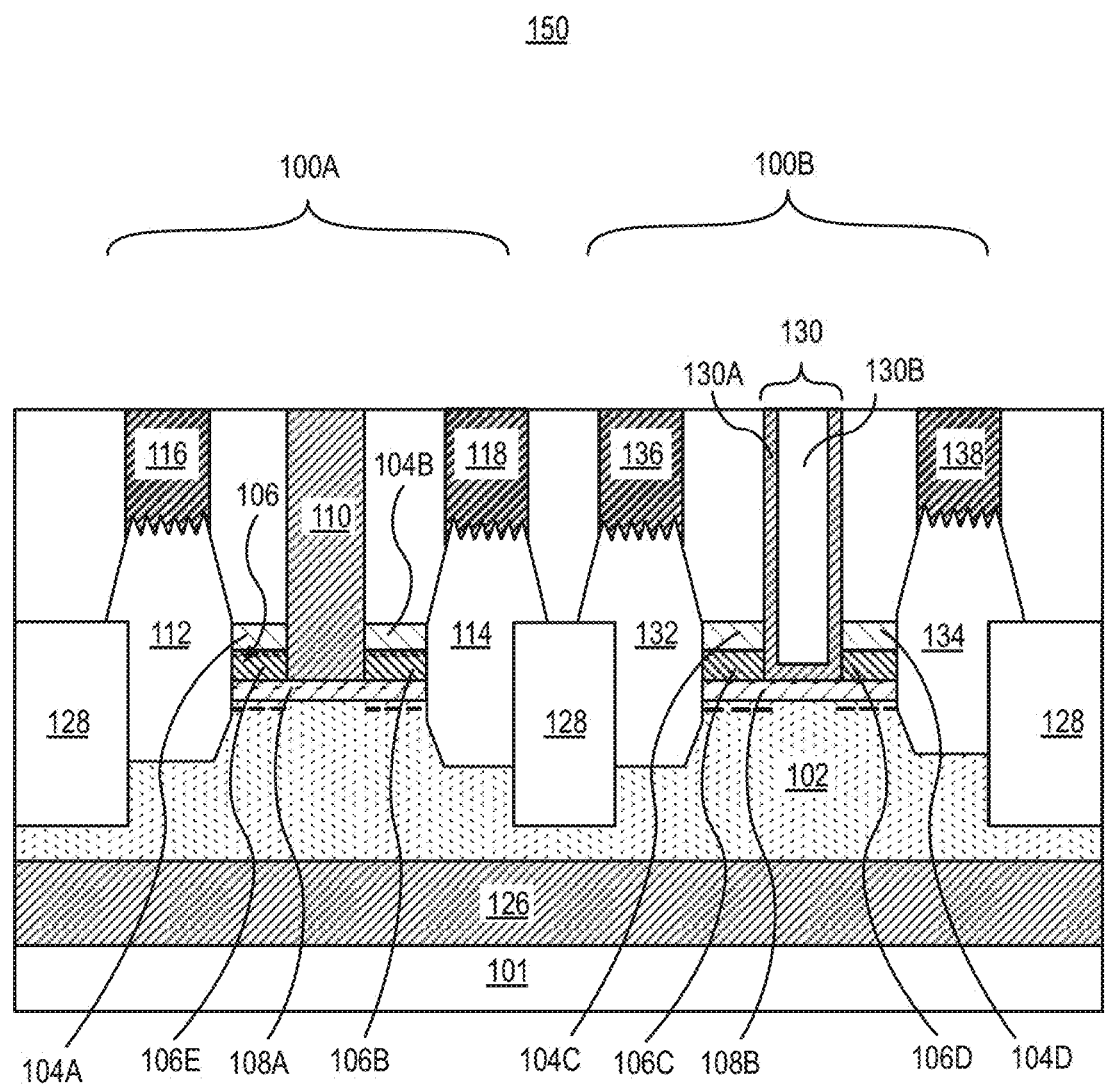
FIG. 1D illustrates a cross-sectional view of a device including a diode and transistor on the first III-N semiconductor material, in accordance with embodiments of the present disclosure.

Diodes and group III-N transistors, and their methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as operations associated with group III-N transistor, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

Electrostatic discharge (ESD) is one of the most prevalent threats to electronic components. In an ESD event, a large amount of charge is transferred during the fabrication process to a component of a microchip (e.g. transistor, capacitor etc.). The ESD event can lead to large amounts of current to pass through the components of a microchip within a very short period of time. Large amounts of uncontrolled current can cause device degradation and, in some cases, render the device dysfunctional. Thus, designing and integrating structures to protect integrated circuits against ESD events is an important component of the semiconductor device fabrication process. The problem of ESD becomes even greater when the substrate utilized to build the electronic components cannot discharge the accumulated extra charge adequately. An electronic device such as a III-N transistor fabricated on an intrinsic III-N material may require additional components for protection against ESD events. A semiconductor device such as a diode can be readily integrated into the circuitry and may help protect components such as a III-N transistor. Integration schemes that can co-fabricate a III-N transistor alongside a diode on a single substrate can offer ESD protection, provide significant process advantages, and potentially offer cost benefits.

In one embodiment, a diode and a III-N transistor are co-fabricated side by side using a stack of layers that include a plurality of III-N materials chosen to simultaneously enable diode and transistor performance. In an embodiment, a III-N transistor includes a polarization layer that may be chosen to induce a 2D electron gas (2DEG) in a III-N channel layer below the polarization layer. While the polarization layer may be optimal for the III-N transistor, a III-N diode, such as for example a Schottky diode having a metal-semiconductor junction comprising the polarization layer may not exhibit optimal current-voltage characteristics (e.g., high on-current and a low reverse leakage). For superior electrical characteristics, the III-N diode may benefit from an additional III-N material layer.

To enable co-fabrication of a III-N transistor and a III-N diode on a same level above a substrate, a III-N material layer may be inserted between the polarization layer and the III-N channel material provided that the intervening III-N material layer does not impede the functionality or performance of the adjacent III-N transistor. In an embodiment, the intervening III-N material layer facilitates high diode on-current and/or relatively low reverse leakage, In an embodiment, the on-current can be as high as 1 e 04 A/um at approximately 3V. The intervening III-N material layer sufficiently thin so as to still allow the formation of the 2DEG employed in both the III-N diode and in the III-N transistor. Although not required, the intervening III-N material may itself also induce a 2DEG to some degree (i.e., the intervening III-N material may also function as a polarization layer). However, the composition of the intervening III-N material is free to differ from that of the polarization layer so as to improve the diode performance.

To further improve reverse leakage characteristics of a diode, a dielectric spacer may be inserted between a sidewall of a first diode terminal and adjacent III-N material layers. The dielectric spacer may help to lower reversed bias leakage current between the first diode terminal and an adjacent second diode terminal that may be in close proximity.

The diode and the transistor may further include terminal structures that are n-doped semiconductor (for conductivity). For example, the diode and the transistor each include a pair of n-doped terminal structures, where the diode has a metal terminal between a first pair of n-doped terminal structures and the transistor has a gate (a gate electrode isolated by a gate dielectric layer) between a second pair of n-doped terminal structures.

FIG. 1A illustrates a cross-sectional illustration of a device 100, including a diode 100A and a transistor structure 100B adjacent to the diode 100A. The diode 100A, includes a first group III-nitride (III-N) material layer 102, a polarization layer 104 including a second III-N material. An intervening layer 106 including a third III-N material is between the polarization layer 104 and the III-N material layer 102.

The intervening layer 106 includes a III-N material that, for example, forms a good Schottky junction with a terminal 110, and may support a high on-current (forward biased diode) and/or a low reverse leakage when a potential difference is applied between the terminal 110 and either of the terminal structure 112 or terminal structure 114. The intervening layer 106 has a thickness between 1 nm and 10 nm. The polarization layer 104 includes a III-N material that induces a 2-dimensional carrier gas, such as a 2DEG, as indicated by the dashed lines 105. 2DEG 105 is within channel layer 102 near an interface 107 of the channel layer 102 and the 1 nm-10 nm thick intervening layer 106. The presence of the 2DEG supports current conduction in the III-N material layer 102 when a potential difference is applied between the terminal 110 and a raised structure 112 or raised structure 114.

The diode 100A further includes terminal 110 that extends through the polarization layer 104, and in at least a portion of the intervening layer 106. In the illustrative embodiment, the terminal 110 embodiment is partially embedded in a recess in the intervening layer 106, which may be advantageous for high on-current operation. Also, as the terminal 110 is between two polarization layer portions 104A and 104B, the 2DEG may be absent immediately below the terminal 110 (confined within regions of the channel layer 102 that are laterally spaced apart from the junction of terminal 110).

The diode 100A includes a second terminal structure 112. As shown, the diode 100A includes a second terminal structure 112 and another terminal structure 114 on opposite sides of the terminal 110. The terminal structure 112 and the terminal structure 114 may each include a doped III-N material. In an embodiment, the terminal structure 112 and the terminal structure 114 are electrically coupled to a common circuit node.

In an embodiment, the polarization layer 104 includes more indium than the intervening layer 106. The polarization layer 104 and the intervening layer 106 may both include compounds of Al, Ga, In and N, such as for example, AlInGAN with different indium concentrations. For example, intervening layer 106 may include less than 5 atomic percent indium and the polarization layer 104 may include at least 15 atomic percent indium.

In another embodiment, the intervening layer 106 includes no indium, whereas the polarization layer 104 includes indium. In some such embodiments, the polarization layer 104 includes for example AlInGaN, and the intervening layer 106 includes AlGaN. When indium is absent from intervening layer 106, the composition of the intervening layer 106 may be uniform. A uniform composition may deter localized weak spots for current leakage.

In yet another embodiment, the intervening layer 106 includes a greater atomic percentage of gallium than the polarization layer 104. For example, the intervening layer 106 may include $Al_zGa_{1-z}N$, where Z ranges between 0.2 and 0.3, while polarization layer 104 includes AlInGAN, where the atomic percent of gallium in $Al_zGa_{1-z}N$ is greater than an atomic percent of gallium in AlInGAN.

In another embodiment, polarization layer 104 does not include gallium, and the intervening layer 106 includes gallium. For example, the polarization layer 104 may include a material such as $Al_wIn_{1-w}N$, where W ranges between 0.7 and 0.85 and intervening layer 106 includes $Al_zGa_{1-z}N$, where Z ranges between 0.2 and 0.3.

In embodiments where intervening layer 106 includes three or more of Al, In, Ga and N, such as for example, $Al_zGa_{1-z}N$ or AlInGAN, the concentration of gallium in the intervening layer 106 is greater than a concentration of aluminum. A higher gallium concentration compared to a concentration of aluminum may deter polarization inversion and AlGaN film relaxation.

In an embodiment, the polarization layer 104 has a thickness that is greater than a thickness of the intervening layer 106. The polarization layer 104 has a thickness between 3 nm and 20 nm. A thickness between 3 nm and 20 nm may support 2DEG under the top surface 102A of the first III-N material layer 102. When a polarization layer 104 includes a material such as $Al_wIn_{1-w}N$, the polarization layer 104 has a thickness between 3 nm and 10 nm.

The intervening layer 106 may have a thickness between 2 nm and 3 nm. Lower thicknesses may reduce on-resistance in the diode 100A, and/or provide other benefits. In an embodiment, when the intervening layer 106 is approximately 3 nm, the polarization layer 104 is at least 4 nm.

The diode 100A further includes a mobility layer portion 108A of the mobility layer 108 between the III-N material layer 102 and the intervening layer 106. In an embodiment, the mobility layer 108 includes a group III-N material such as but not limited to AlN or InAlN. In an embodiment, the mobility layer 108A has an insufficient thickness to independently induce a sufficient 2DEG. For example, a mobility layer 108A having a thickness of less than 1 nm may not introduce any significant 2DEG. In an embodiment, the mobility layer 108 and the underlying III-N material layer 102 are binary alloys. In one such embodiment, an enhanced electron confinement can result in the vicinity of top surface 102A of the III-N material layer 102. Enhanced electron mobility may be a result of reduced alloy scattering. In one such embodiment, the mobility layer 108 is AlN and the underlying III-N material layer 102 is GaN. In an embodiment, an AlN mobility layer 108 has a bandgap that is greater than the bandgap of a GaN-III-N material layer 102. In one such embodiment, the AlN-mobility layer 108 has a bandgap (6.02 eV) that is wider than the bandgap of the GaN III-N material layer 102 (3.4 eV), generating a barrier at an interface between the AlN mobility layer 108 and the GaN III-N material layer 102. The presence of the barrier and/or reduced alloy scattering may enable enhanced electron mobility in the III-N material layer 102.

The transistor structure 100B includes the III-N material layer 102, a gate 130 including a gate dielectric layer 130A and a gate electrode 130B above the III-N material layer 102, and a terminal structure 132 and a terminal structure 134 on opposite sides of the gate 130. With the the gate dielectric layer 130A, transistor structure 100B has a metal-insulator-semiconductor field effect transistor (MISFET) architecture. A MISFET architecture has the advantage of being independent of the architecture of the diode structure 100A as the transistor gate does not rely on a metal-semiconductor junction.

The transistor structure 100B may be an enhancement mode or a depletion mode device. As shown in FIG. 1A, the transistor structure 100B is an enhancement mode device. The gate 130 separates the polarization layer 104 into a polarization layer portion 104C and a polarization layer portion 104D. In the illustrative embodiment, the gate 130 also separates the intervening layer 106 into a intervening layer portion 106C and a intervening layer portion 106D. As shown, the gate 130 is in contact with an uppermost surface of the mobility layer 108B. In other embodiments, the gate 130 may be in a recess in a portion of the intervening layer 106 (not shown), or in a recess in a portion of the polarization layer 106.

In an embodiment, the gate 130 includes a gate dielectric layer 130A and a gate electrode 130B on the gate dielectric layer 130A. In the illustrative embodiment, the gate dielectric layer 130A is between the gate electrode 130B and the mobility layer portion 108B. The gate dielectric layer 130A also has a first portion and a second portion on a sidewall of the gate electrode 130B. A first portion of the gate dielectric layer 130A is between a first sidewall of gate electrode 130B and the polarization layer portions 104D and 106D and a second portion of the gate dielectric layer 130A is between a second sidewall of the gate electrode 130B and the polarization layer portions 104C and 106C as shown.

In an embodiment, the gate dielectric layer 130A is in a recess in the polarization layer 104, and the gate electrode 130B is on the gate dielectric layer 130A in the recess in the polarization layer 104 as shown in the cross-sectional illustration of FIG. 1C. In other embodiments, the gate dielectric layer 130A is on the top surface 106E as shown in FIG. 1B (depletion mode).

The gate dielectric layer 130A may have a high relative permittivity (i.e., dielectric constant, or K, exceeding that of silicon nitride). In some high-K gate dielectric embodiments, the gate dielectric layer 130A is a metal oxide (e.g., including oxygen and one or more metals, such as, but not limited to, aluminum, hafnium, zirconium, tantalum or titanium). In another embodiment, the gate dielectric layer 130A includes silicon and at least one of oxygen (e.g., silicon dioxide) or nitrogen (e.g., silicon nitride). In some examples, the gate dielectric layer 130A has a thickness between 2 nm and 10 nm.

In an embodiment, the gate electrode 106B includes a metal such as, but not limited to, Pt, Ni and an alloy such as TiN or TaN. In one such embodiment, the gate electrode 106B has a gate length, $L_G$, approximately between 10 nm and 100 nm. In some embodiments, the gate electrode 106B further includes a work function metal and a gate cap. The work function metal may include a metal such as Pt, Ni, and an alloy such as TiN or TaN and the gate cap may include a metal, such as W, for example.

Referring again to FIG. 1A, in an embodiment, terminal structures 112, 114, 132 and 134 include a III-N material that is lattice matched to the III-N material layer 102, for example, GaN or InGaN. In an exemplary embodiment, the terminal structures 112, 114, 132 and 134 include an impurity dopant such as an n-type dopant or an n+ dopant. Examples of an n-type dopant includes a material such as Si or Ge. In one embodiment, the n-type dopant material is silicon. As a further example, the silicon n-type dopant may have a n-dopant density of at least $1e19/cm^3$. In the illustrative embodiment, terminal structures 132 and 134 may be either a raised source structure or a raised drain structure of the transistor structure 100B.

In an embodiment, one or more of the terminal structures 112, 114, 132 and 134 may have a respective portion that extends over an isolation region 128. The isolation region 128 may include any material that has sufficient dielectric strength to provide electrical isolation such as, but not to, limited silicon dioxide, silicon nitride, silicon oxynitride, carbon doped nitride and carbon doped oxide.

In an embodiment, the III-N layer 102 has a relatively high carrier mobility, (greater than 500 $cm^2$ $V^{-1}$). The III-N material layer 102 may be a substantially un-doped group III-nitride material (i.e., $O_2$ impurity concentration minimized) for minimal impurity scattering. In some embodiments, the III-N material layer 102 is gallium nitride (GaN). In other embodiments, the III-N material layer 102 includes one or more ternary alloys of GaN, such as AlGaN, AlInN, or a quaternary alloy of GaN including at least one group III element and nitrogen, such as $In_xAl_yGa_{1-x-y}N$, where x ranges from 0.01-0.1 and y ranges from 0.01-0.1. Depending on applications, the III-N material layer 102 has a thickness between 100 nm-5 um.

In an embodiment, the device 100 includes a buffer 126 between the substrate 101 and the III-N material layer 102. The buffer 126 may include a plurality of layers of III-N materials above the substrate 101. In an embodiment, the buffer layer 126 has a thickness that minimizes crystal defects in the channel layer 108 that would ordinarily arise from lattice mismatch between the channel layer 108 and the underlying substrate 101. In an embodiment, the buffer layer 126 has a thickness that is between 400 nm and 3 microns. The layers may be interleaved with two or more layers of III-N materials such as but not limited to $Al_zGa_{1-z}$ N, $Al_wIn_{1-w}$ or AlN. In one embodiment, the buffer 126 includes three layers of $Al_zGa_{1-z}N$ on a layer of AlN, where the three layers of $Al_zGa_{1-z}N$ have decreasing Al content in each layer. In one such embodiment, the uppermost layer has a lowest amount of Al content of the three layers, resulting in a large band-gap that limits substrate leakage currents.

In an embodiment, the substrate 101, includes a semiconductor material. In some embodiments, the buffer 126 and the substrate 101 have mismatched lattice structures. The lattice mismatch between the buffer layer 126 and the substrate 101 may be between 15%-50%. Exemplary substrates include, but are not limited to, silicon, silicon germanium (Ge) or silicon carbide (SiC). In an exemplary embodiment, the substrate 101 is a silicon substrate having a (100) top surface. A silicon substrate with a (100) top surface may facilitate co-integration of silicon CMOS transistor technology with a III-N material. In another embodiment, a silicon substrate has a <111> top surface.

The terminal 110 may be in contact with the mobility layer 108A without sacrificing diode performance. The mobility layer 108A may provide a landing junction for the terminal 110 for high-on operation.

FIG. 1D illustrates a cross sectional view of a device 150 where the terminal 110 of the diode 100A is on the mobility layer 108. The intervening layer 106 in the diode 100A has two portions 106B and 106E that are separated by the terminal 110. The polarization layer portions may provide sidewall junctions for the diode 100A and/or may improve reverse leakage characteristics of the diode.

An absence of polarization layer 104 and/or intervening layer 106 from directly under the terminal 110 may eliminate the 2DEG under the terminal, as shown. In such an embodiment, the diode 100A is in an electrically off state when a potential difference of 0V is applied between the terminal 110 and either of the terminal structures 112 or 114. In an embodiment, the diode 100A is in an electrically conductive state when a finite positive potential difference is applied between terminal 110 and either of the terminal structures 112 or 114. For example, during an ESD discharge the charge travels through the terminal 110 into the III-N material layer 102.

As discussed above, terminal 110 in contact with intervening layer 106A, as shown in FIG. 1A, may cause a low level of reverse bias current leakage. Leakage current can be less than for example 1e-10A/micrometer. To suppress the reverse bias current further, the diode 100A may include a spacer 202 between the terminal 110 and the intervening layer 106, as illustrated in the device 200 in FIG. 2A. A spacer 202 may be inserted adjacent to sidewalls 110A and 110B of the terminal 110. A spacer 202 having a high bandgap, for example bandgap greater than 4 eV is desirable to prevent charge leakage from the terminal 110 to the raised structures 112 or 114 (e.g., through a Schottky junction with polarization layers 104 and 106 if spacer 202 is absent). The spacer 202 may provide resistance for reversed bias leakage. However, the portion of the intervening layer 106 that is in contact with the terminal 110 provides a junction for the diode 100A for high on-current. The current flow during diode operation may be constricted to flow through an interface between the terminal 110 and the intervening layer 106 in the recess.

In the illustrative embodiment, the terminal 110 is partially embedded into a recess in the intervening layer 106A. The spacer portion 202A is partially embedded in the recess in the intervening layer 106A and is between the terminal sidewall 110A and the polarization layer portion 104A. The spacer portion 202B is partially embedded in the recess in the intervening layer 106A and is between the terminal sidewall 110B and the polarization layer portion 104B. In an embodiment, the amount of recess in the intervening layer 106A is between 1 nm and 2 nm. In an embodiment, the spacer 202 has lower most portions that are co-planar or substantially co-planar with a lowermost portion of the terminal 110.

In an embodiment, the spacer 202 includes a dielectric material having a low dielectric constant, for example a dielectric constant of less than or equal to 3. In other embodiments, the spacer 202 includes a metal and oxygen such as $Al_2O_3$ or includes silicon and at least one of oxygen (e.g., silicon dioxide) or nitrogen (e.g., silicon nitride).

In other embodiments, the diode 100A illustrated in FIG. 1B may also include a spacer to suppress reversed leakage. The spacer may provide a barrier against charge leakage. However, in such embodiments an underlying mobility layer that is in contact with the terminal is sufficiently thin and provides a landing junction for the diode.

Figure 2A:
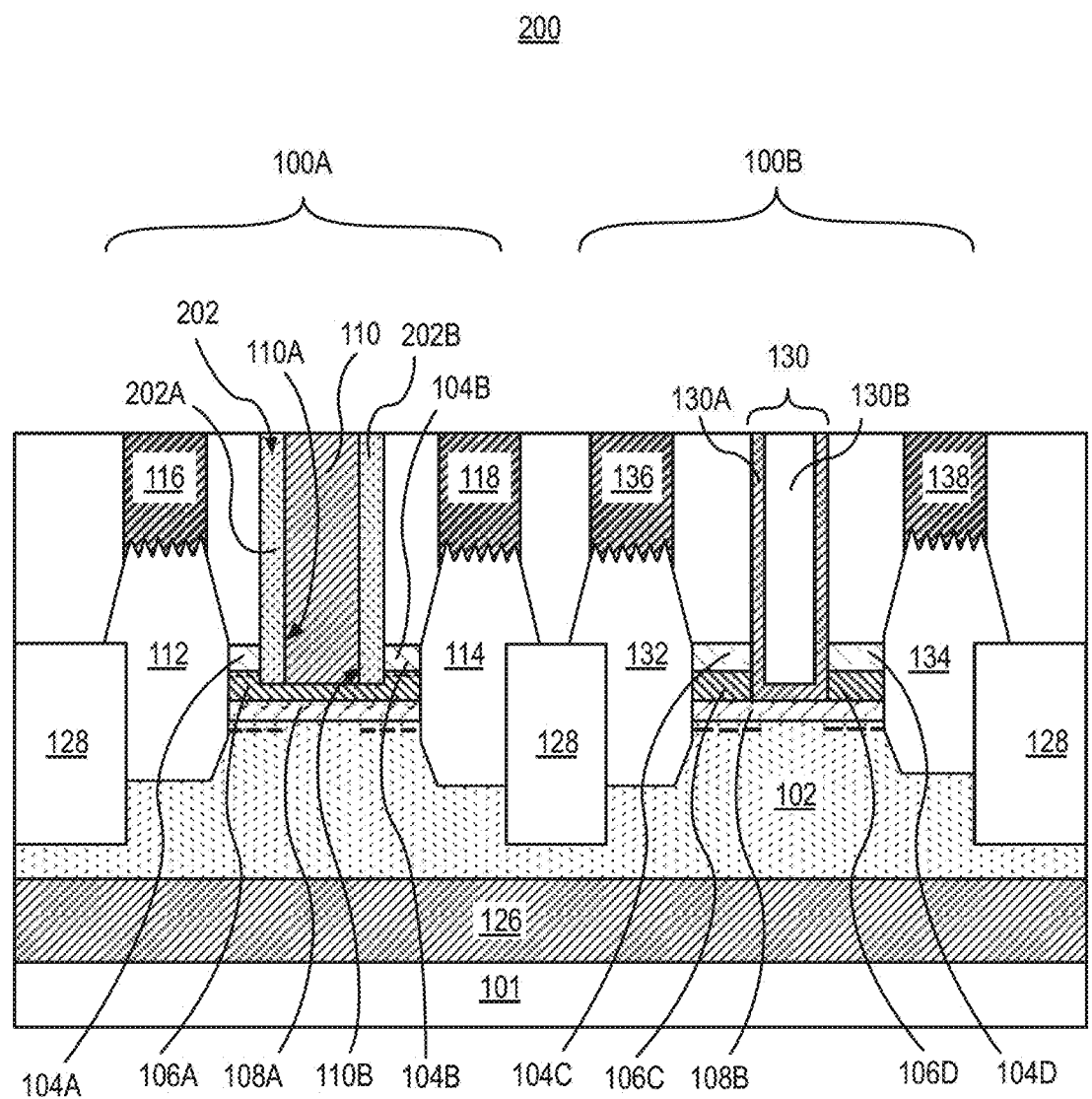
FIG. 2A illustrates a cross-sectional view of a device including a diode with a spacer adjacent to a terminal and transistor on a first III-N semiconductor material, in accordance with embodiments of the present disclosure.
Figure 2B:
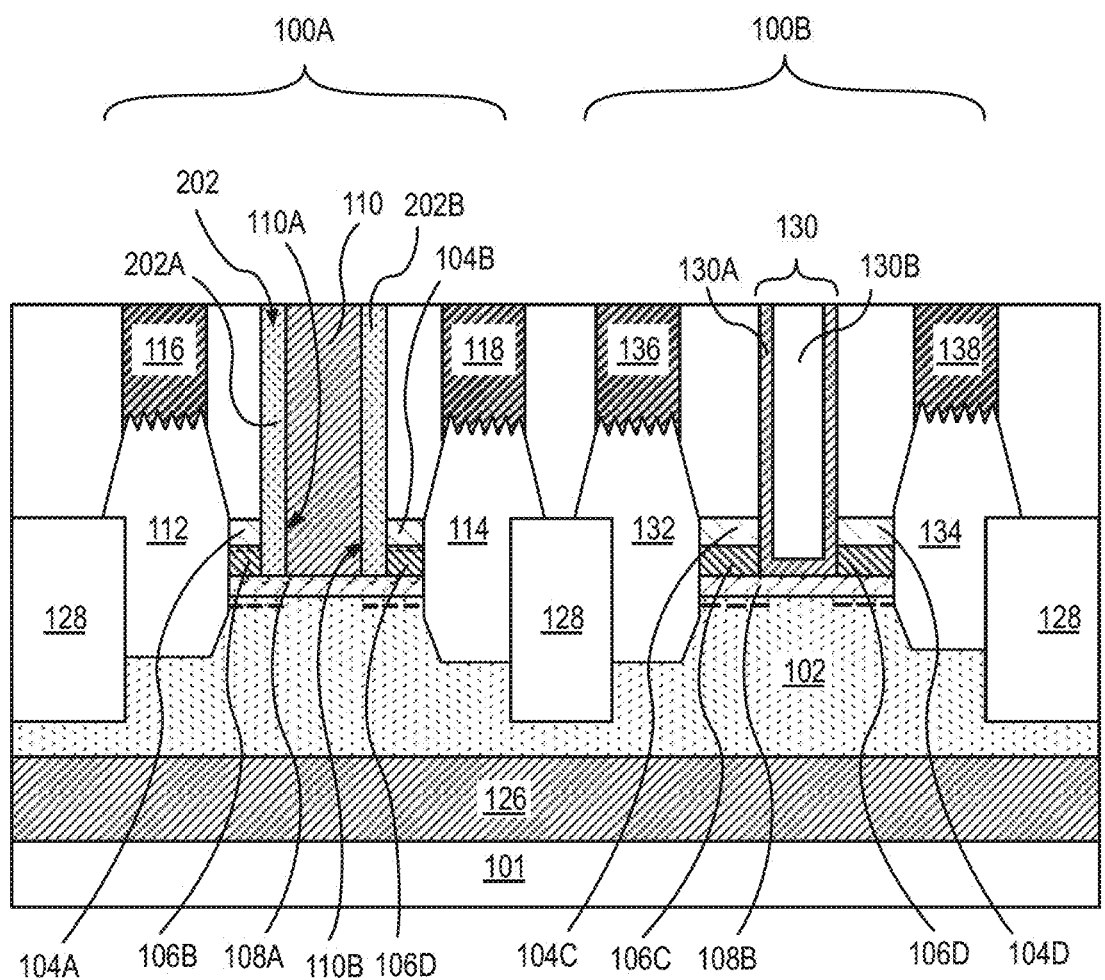
FIG. 2B illustrates a cross-sectional view of a device including a diode with a spacer adjacent to a terminal partially embedded in a polarization layer and a transistor on a first III-N semiconductor material, in accordance with embodiments of the present disclosure.
Figure 2B:
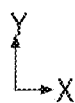

FIG. 2B illustrates a device 250, where a spacer 202 is adjacent to the terminal 110. The terminal 110 separates the layer portions 104A and 106B from the layer portions 104B and 106D, respectively. The spacer 202 has a spacer portion 202A that is between the terminal sidewall 110A and a sidewall of the polarization layer 104A. In the illustrative embodiment, the spacer portion 202A is between the terminal sidewall 110A and the intervening layer portion 106B. The spacer 202 also includes a spacer portion 202B adjacent to a sidewall of the polarization layer portion 104B and to a sidewall of the intervening layer portion 106D, as shown.

The transistor structure 100B has one or more features of the transistor structure 100B described in association with FIG. 1A.

Figure 2C:
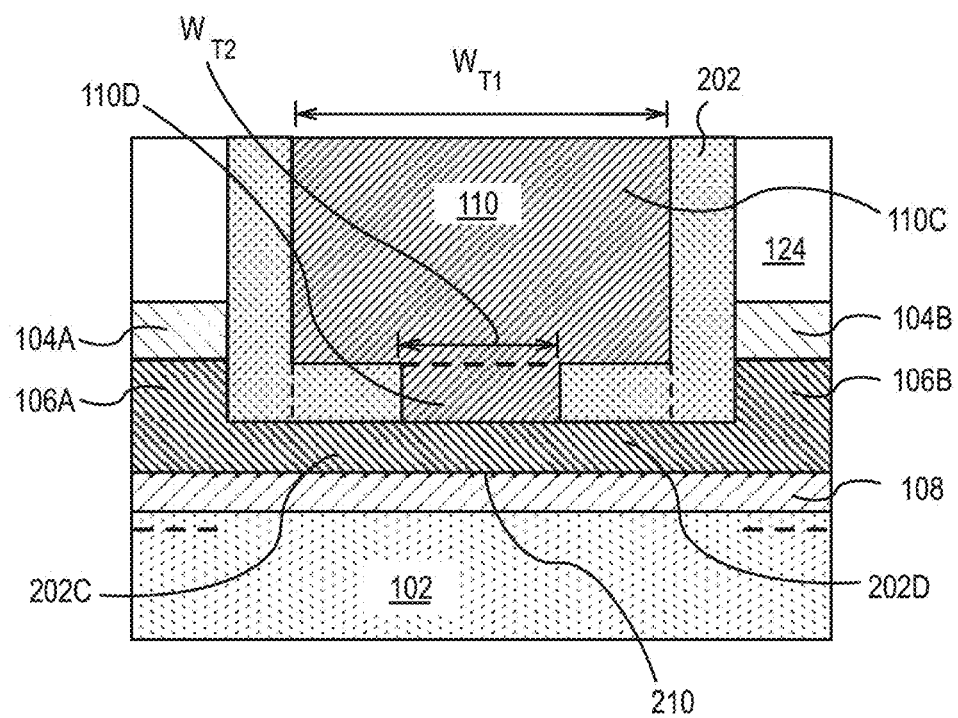
FIG. 2C illustrates a cross-sectional view of the spacer adjacent to a sidewall of the terminal on a third III-N semiconductor material, where the spacer has a lateral portion between a portion of the terminal and the third III-N semiconductor material.

FIG. 2C illustrates an expanded cross-sectional view of a portion of the diode 100A, where the spacer 202 has lateral portions 202C and 202D between a portion of the terminal 110 and the mobility layer 108. The spacer 202 is designed to enable the terminal 110 to have a portion 110D that is in contact with the intervening layer 106. Portion 110D has a narrower width than the remaining portion of the terminal 110. In such an embodiment, the forward current of the diode 100A can be increased during forward bias operation due to current crowding between the terminal 110 and the intervening layer 106.

In the illustrative embodiment, the terminal 110 has a wide body portion 110C having a first width $W_{T1}$ and a narrow portion 110D in contact with the intervening layer 106 having a second width, $W_{T2}$, where $W_{T1}$ is greater than $W_{T2}$. In an embodiment, $W_{T2}$ is between 10% and 50% of $W_{T1}$. The terminal portion 110C is between spacer portions 202A and 202B. The terminal portion 110D, that is in contact with intervening layer 106, is between spacer portions 202C and 202D.

FIG. 3 is a flow diagram of a method to fabricate a device including a diode and a group III-N transistor, such as device 100 illustrated in FIG. 1A, in accordance with embodiments of the present disclosure. In an embodiment, the method 300 begins at operation 310 by forming a group III-N semiconductor material above a substrate. The method 300 continues in operation 320 by forming one or more polarization layers on the group III-N semiconductor material. The method 300 continues in operation 330 by forming a plurality of terminals in the group III-N semiconductor material. In an embodiment, the plurality of terminals is formed by forming a plurality of recesses in the group III-N semiconductor material and then epitaxially growing a doped III-N material in each of the plurality of recesses. The method 300 continues in operation 340 with the formation of a diode terminal between a first pair of terminals to form a diode. The method 300 concludes in operation 350 by forming a gate structure on the polarization layer between a second pair of terminals to form a transistor.

FIGS. 4A-4J illustrate cross sectional views of a method to fabricate the group III-N transistor 100A illustrated in FIG. 1A evolving as a fabrication method, such as method 300, is practiced.

FIG. 4A illustrates a cross-sectional view of a stack of III-N materials 400 formed above a substrate 101. In an embodiment, the stack of III-N materials 400 includes a III-N material layer 102 on a buffer layer 126 formed above a substrate 101, an intervening layer 106 formed on the III-N material layer 102 and a polarization layer 104 formed on the polarization layer 104. In the illustrative embodiment, the III-N material layer 102 acts as a channel layer for a transistor to be fabricated and a conductive region for a diode to be co-fabricated adjacent to the transistor. In an embodiment, a silicon substrate 101 with a (100) top surface may facilitate co-integration of silicon CMOS transistor technology with a III-N material. In a second embodiment, the silicon substrate 101, has a (111) top surface. In embodiments, the buffer layer 126 and the substrate 101 have mismatched lattice structures. The lattice mismatch between the buffer layer 126 and the substrate 101 may be between 15%-50%.

In an embodiment, the buffer layer 126 is formed between the III-N material layer 102 and the substrate 101 to overcome lattice and thermal mismatch between the substrate 101 and the buffer layer 126. In an embodiment, the buffer layer 126 is grown on the substrate 101 by a metal organic chemical vapor deposition (MOCVD) process at a temperature in the range of 1000-1100 degrees Celsius. In an embodiment, the buffer layer 126 has a material composition that is the same or substantially the same as the buffer layer 126. In an exemplary embodiment, the buffer layer 126 includes AlGaN. The buffer layer 126 including AlGaN may be grown to a thickness between 100 nm and 200 nm to minimize lattice mismatch between the III-N material layer 102 and the substrate 101.

In an embodiment, the III-N material layer 102 is grown above the substrate 101 by a metal organic chemical vapor deposition (MOCVD) process at a temperature in the range of 1000-1100 degrees Celsius. In an embodiment, the III-N material layer 102 includes GaN. In an embodiment, the GaN III-N material layer 102 is grown to a thickness that is approximately between 100 nm and 5 micrometers. The III-N material layer 102 may have a defect density less than (1e10/cm2) when grown to a sufficient thickness, such as a thickness of at least 100 nm.

In an embodiment, the intervening layer 106 is formed on the group III-N semiconductor material 202. The intervening layer 106 may be formed using a MOCVD process and grown immediately after the growth of the group III-N semiconductor material of the channel layer 102. In an embodiment, the intervening layer 106 is grown by a MOCVD process at a temperature in the range of 1000-1100 degrees Celsius. Depending on the embodiment, the intervening layer 106 includes a material such as but not limited to AlN, AlInN (where indium is less than 5 atomic percent), or $Al_yGa_{1-y}N$ (where y is 0.24-0.4) and the III-N material layer 102 includes a material such as but not limited to InGaN or GaN. The intervening layer 106 may be grown to a thickness between 2 nm and 3 nm.

The polarization layer 104 may be formed on the polarization charge inducing layer 106 using a MOCVD process and grown immediately after the growth of the polarization layer 104 and the III-N material layer 102. In an embodiment, the polarization layer 104 is grown by a MOCVD process at a temperature in the range of 1000-1100 degrees Celsius. Depending on the embodiment, the polarization layer 104 includes a material such as, but not limited to AlInN, AlInGaN (where the indium concentration is at least 15 atomic percent) The polarization layer 104 may be grown to a thickness between 3 nm and 20 nm. In an exemplary embodiment, the polarization layer 104 is AlInN. A polarization layer 104 having a thickness between 3 nm and 10 nm may induce a 2-dimensional electron gas 105 within the III-N material layer 102 below a top surface 102A.

FIG. 4B illustrates the structure of FIG. 4A, following the formation of a plurality of recesses 401 in a portion of the stack of III-N materials 400. In the illustrative embodiment, the plurality of recesses 401 are formed in a first polarization layer 104, in a second intervening layer 106 and in a III-N material layer 102. The recesses may not, for example, extend into a buffer layer 126 between the III-N material layer 102 and the substrate 101. In an embodiment, a mask (not shown) is formed on the first polarization charge inducing layer 104. In one embodiment, a plasma etch process is utilized to etch the first polarization charge inducing layer 104, the second intervening layer 106 and the III-N material layer 102 through an exposed area in the mask to form openings 401. The openings 401 may be sufficiently deep to provide isolation for source and drain trenches to be formed. In one embodiment, the opening 401 has a depth between 75 nm and 200 nm.

Figure 4C:
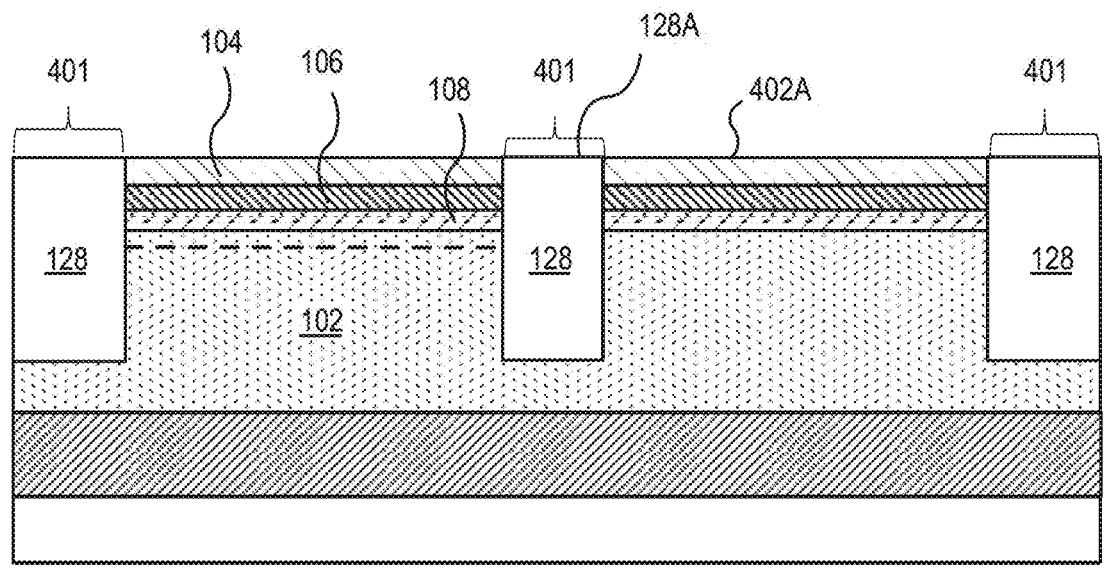
FIG. 4C illustrates the structure of FIG. 4B, following the formation of an isolation structure in each of the plurality of recesses.

FIG. 4C illustrates the structure of FIG. 4A, following the formation of isolation region 128 in the openings 401. In the illustrative embodiment, the isolation region 128 is formed on the III-N material layer 102 and adjacent to the polarization charge inducing layer 104. In an embodiment, a dielectric material is blanket deposited in the opening and on the polarization layer 104. Examples of the dielectric material may include any material that has a sufficient dielectric strength to provide electrical isolation such as, but not to, limited silicon dioxide, silicon nitride, silicon oxynitride, carbon doped nitride and carbon doped oxide. The dielectric material is subsequently planarized, for example using a chemical mechanical polish (CMP) process. In the illustrative embodiment, the CMP process forms the isolation region 128 having an uppermost surface 128A that is co-planar or substantially co-planar with an uppermost surface 104A of the polarization charge inducing layer 104.

Figure 4D:
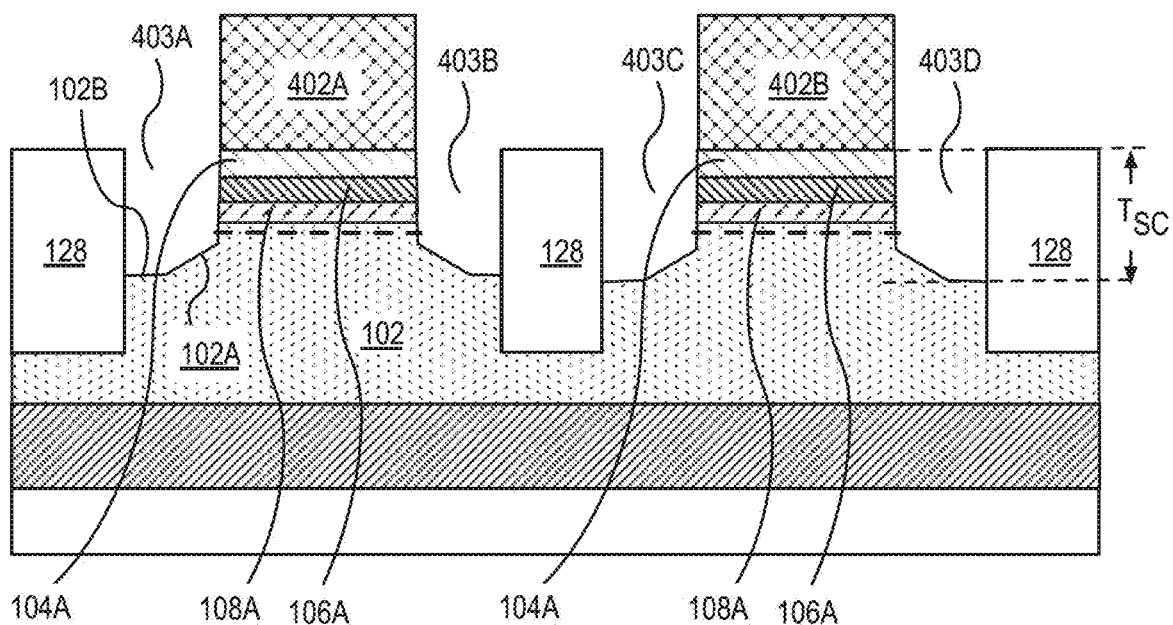
FIG. 4D illustrates the structure of FIG. 4C, following the formation of trenches in portions of the first and the second polarization layers, and in portions of the III-N material adjacent to the isolation structures.

FIG. 4D illustrates the structure of FIG. 4C, following the formation of a plurality of recesses such as for example 403A, 403B, 403C and 403D in the polarization layers 104, 106 and in the channel layer 102. In an embodiment, masks 402A and 402B are formed on portions of the polarization charge inducing layer 104 between a pair of isolation region 128. The masks 402A, 402B may include a material that can withstand high temperature processing such as a silicon oxide or a silicon nitride. A silicon oxide or a silicon nitride may be removed selectively with respect to the polarization layer 104 in a downstream operation. In an embodiment, a plasma etch process is utilized to etch unmasked portions of the polarization layer 104 and continued until a portion of the III-N material layer 102 is etched to form trenches 403A, 403B, 403C and 403D. The trenches 403A, 403B, 403C and 403D have a height, $H_R$ as measured with respect the surface 102B. In an embodiment, $H_R$, is between 30 nm and 100 nm. The III-N material layer 102, has sloped sidewalls 102A and an approximately flat lowermost surfaces 102B. The sloped sidewalls 102A may be defined by a linear facet or have a profile that has a compound slope (not depicted).

Figure 4E:
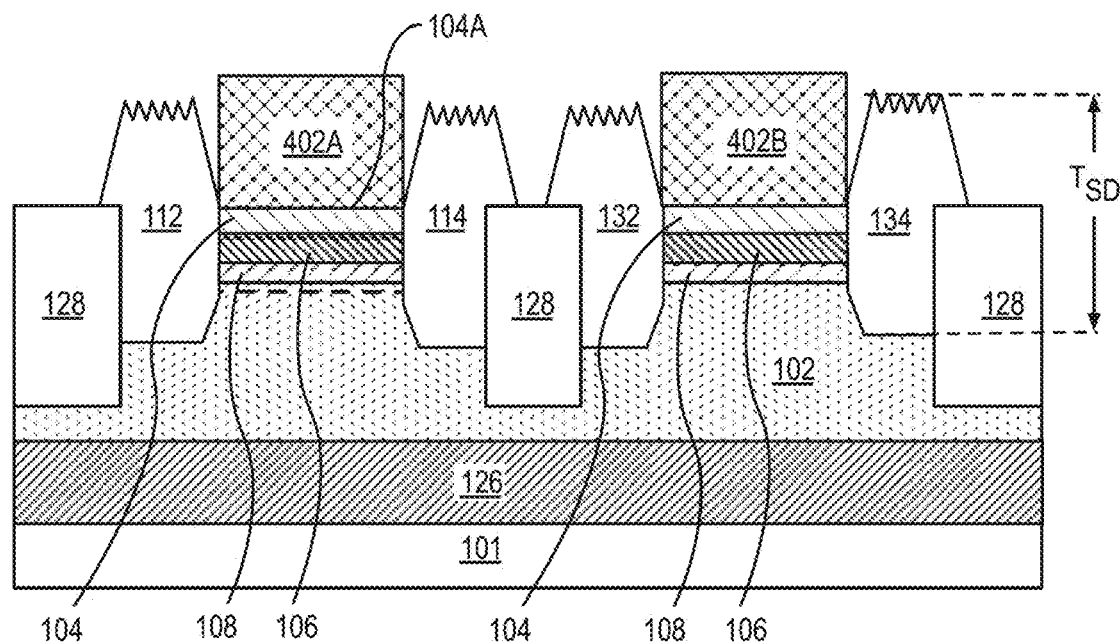
FIG. 4E illustrates the structure of FIG. 4D following the formation of a raised structure in each of the trenches.

FIG. 4E illustrates the structure of FIG. 4D, following the formation of raised structures 112, 114, 132 and 134 in the trenches 403A, 403B, 403C and 403D, respectively. In an embodiment, raised structures 112, 114, 132 and 134, are epitaxially grown sufficiently thick to fill trenches 403A, 403B, 403C and 403D, respectively. In an embodiment, the raised structures 112, 114, 132 and 134 are epitaxially grown using a metal organic chemical vapor deposition MOCVD process. In the illustrative embodiment, the raised structures 112, 114, 132 and 134 grow above the uppermost surface 104A of the polarization layer 104 and extend laterally onto portions of the isolation regions 128 respectively through a process of lateral epitaxial overgrowth.

In an embodiment, the raised structures 112, 114, 132 and 134 include an n-type doping. The n-type doping may be performed in-situ during the MOCVD growth process and includes an n-type dopant such as Si or Ge. In an embodiment, the raised structures 112, 114, 132 and 134 are epitaxially grown to a total thickness, $T_{SD}$, that is between 60 nm and 200 nm.

In an embodiment, such as is illustrated, when the raised structures 112, 114, 132 and 134 are grown by incorporating 10-15 atomic percent indium, the top portions of the raised structures 112, 114, 132 and 134 are formed to have an irregularly shaped divots as illustrated. A sufficiently high indium content, such as indium content above 10 atomic percent, also forms a faceted sidewall on each of the raised structures 112, 114, 132 and 134 as shown.

As desired, any pair of adjacent raised structures such as raised structures 112, 114, or raised structures 132 and 134 can be utilized as a source or drain of a transistor, or as terminals that are connected to a common node in the case of a diode.

Figure 4F:
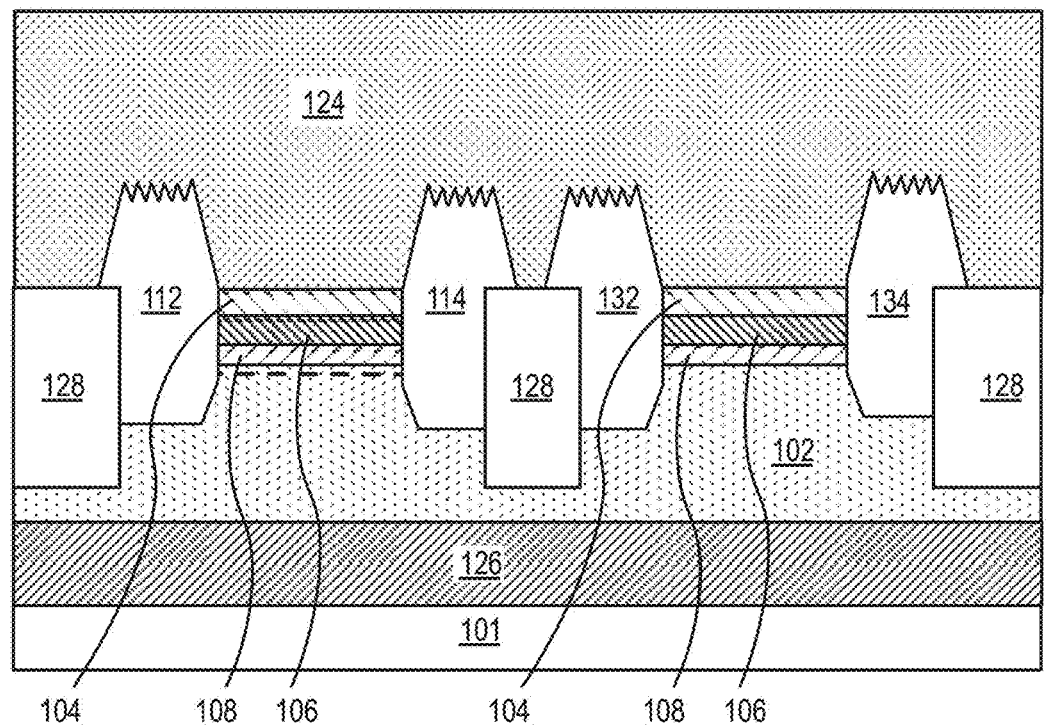
FIG. 4F illustrates the structure of FIG. 4E, following the blanket deposition and planarization of a first dielectric material on the raised structures.

FIG. 4F illustrates the structure of FIG. 4E, following the, removal of the masks 402A, 402B and exposing the polarization layer 104 and formation of a dielectric material 124 on the raised structures 112, 114, 132 and 134, on the polarization layer 104, and on the isolation regions 128. The dielectric material 124 may be blanket deposited. In an embodiment, the dielectric material 124 is subsequently planarized, for example using a chemical mechanical planarization (CMP) process, as shown.

Figure 4G:
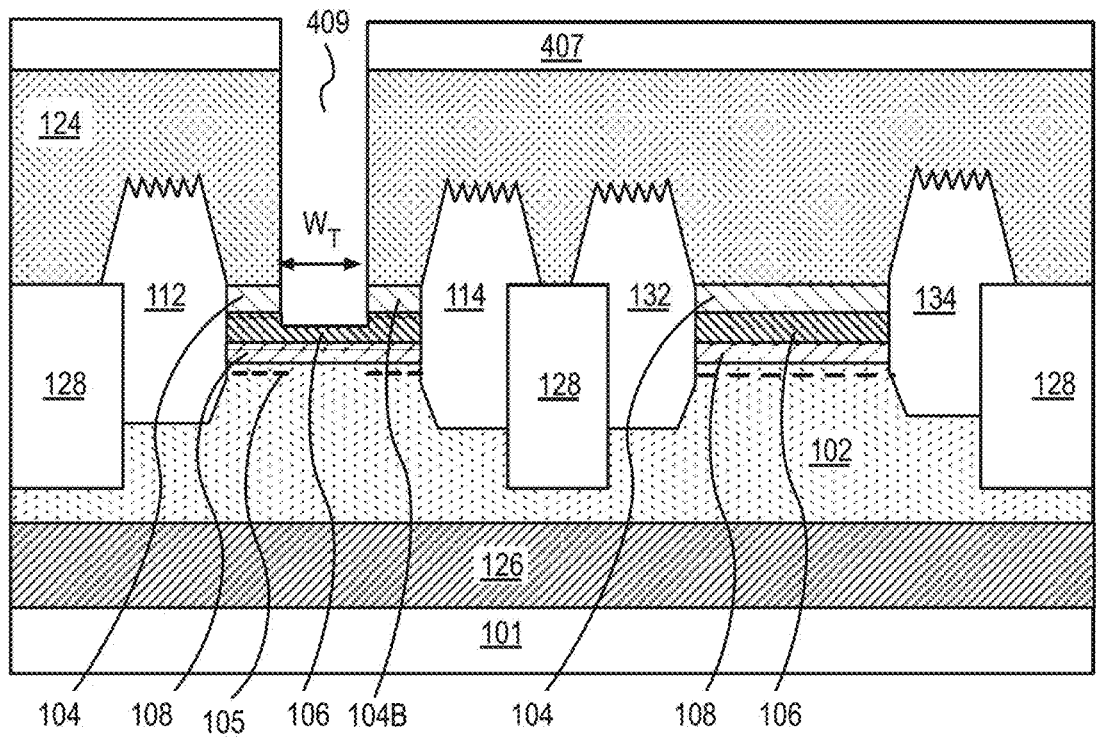
FIG. 4G illustrates the structure of FIG. 4F, following the formation of a mask and etching a terminal opening, in the dielectric material, in the second polarization layer and in a portion of the first polarization layer, where the terminal opening is between a first and a second raised structure.

FIG. 4G illustrates the structure of FIG. 4F, following the formation of a mask 407 and a terminal opening 409 in the dielectric material 124 and in the polarization layers 104 and 106. In an embodiment, an opening in the mask 407 defines a location for the terminal opening 409 to be formed relative to the raised structures 112 and 114. In one embodiment, a plasma etch process is utilized to form the terminal opening 409, where the plasma etch is utilized to first etch the dielectric material 124, etch the polarization layer 104 and etch a portion of the intervening layer 106. In an embodiment, the plasma etch removes approximately 50% of a thickness of the intervening layer 106. As shown, the plasma etch forms polarization layer portions 104A and 104B. In one such embodiment, etching and removing the polarization layer 104 in the opening 409 eliminates the 2DEG from a portion of III-N material layer 102, near the mobility layer 108. In other embodiments, (not illustrated) the plasma etch removes all of the intervening layer 106 and exposes the underlying mobility layer 108. In an embodiment, not illustrated, the terminal opening 409 has a width, at the bottom of the opening, WT, that is approximately between 50 nm and 500 nm.

Figure 4H:
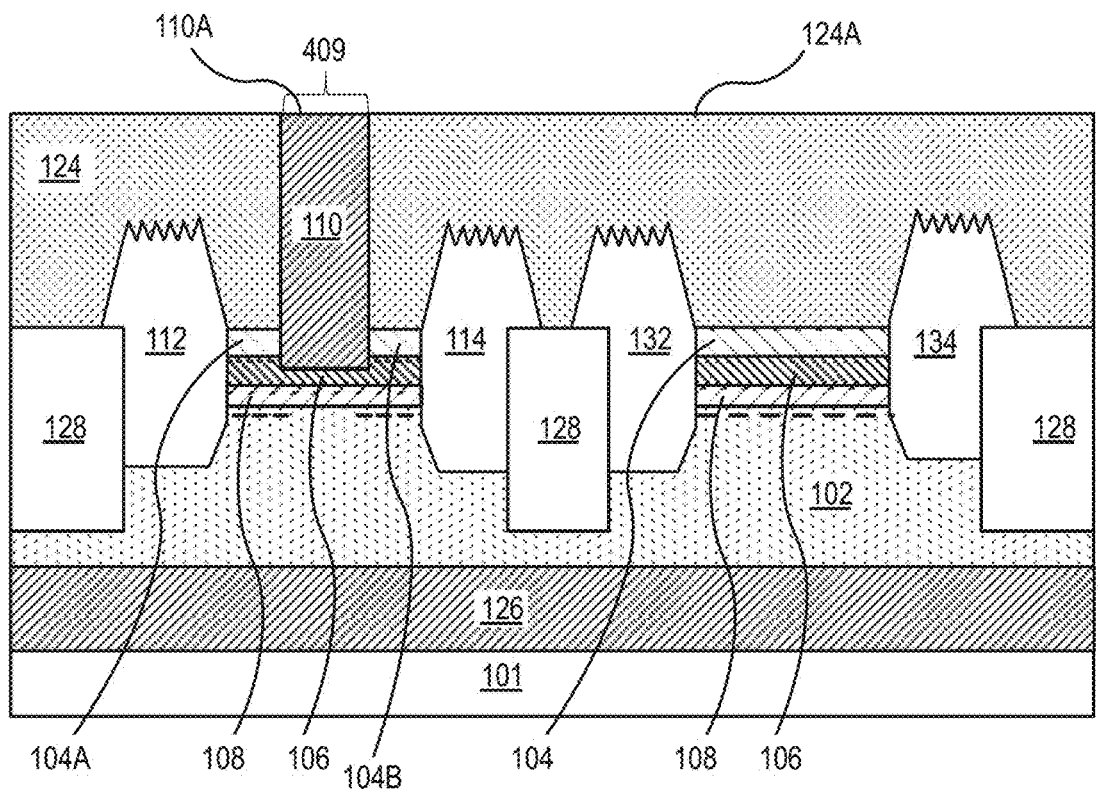
FIG. 4H illustrates the structure of FIG. 4G, following the formation of a terminal in the terminal opening.

FIG. 4H illustrates the structure of FIG. 4G, following the formation of a terminal 110 in the terminal opening 409 and removal of the mask 407. In the illustrative embodiment, formation of the terminal 110 includes blanket depositing a layer of metal or an alloy suitable for forming a Schottky junction in the terminal opening 409, on a portion of the intervening layer 106, on sidewalls of polarization layer 104, on sidewalls of dielectric material 124 and on a top surface 124A of the dielectric material 124.

After deposition of the layer of metal or an alloy a planarization process is performed to remove the overburden from top surface of the terminal 110. In an embodiment, the planarization process includes a CMP process, where the CMP process forms a top terminal surface 110A that is co-planar or substantially co-planar with the top surface 124A of the dielectric material 124, as shown in the cross-sectional illustration of FIG. 4H.

Figure 4I:
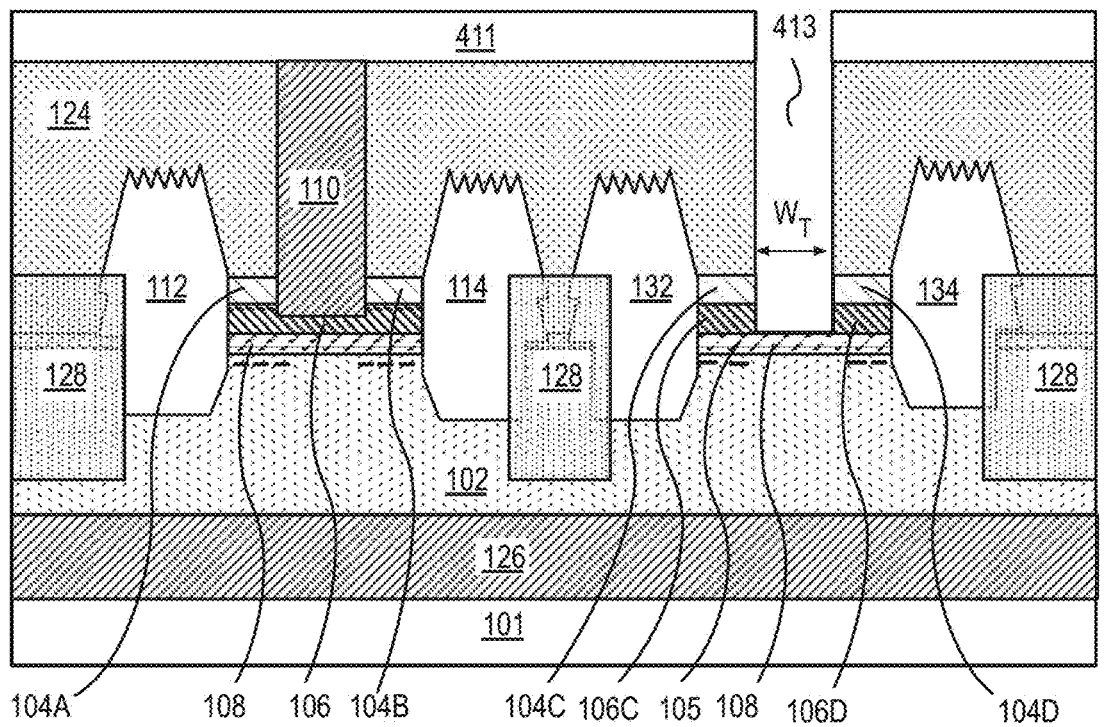
FIG. 4I illustrates the structure of FIG. 4H, following the formation of a mask and etching a gate opening in the dielectric material, in the first polarization layer and in the second polarization layer, wherein the gate opening is between a third and a fourth raised structure.

FIG. 4I illustrates the structure of FIG. 4H, following the formation of a mask 411 and a gate opening 413 in the dielectric material 124 and in the polarization layers 104 and 106. In an embodiment, an opening in the mask 411 defines a location for the gate opening 413 to be formed relative to the raised structures 132 and 134. In one embodiment, a plasma etch process is utilized to form the gate opening 413, where the plasma etch first etches the dielectric material 124, and subsequently etches the polarization layer 104 and the intervening layer 106 selectively to the mobility layer 108. As shown, the plasma etch forms polarization layer portions 104C and 104D, and polarization layer portions 106C and 106D. In one such embodiment, removal of the portion of the intervening layer 106 in the opening 409 removes the 2DEG from the III-N material layer 102 under a portion of the mobility layer 108.

In another embodiment, (not illustrated) the plasma etch is utilized to etch the dielectric material 124 and the polarization layer 104 but not the intervening layer 106.

In yet another embodiment, (not illustrated) the dielectric material 124 and only a portion of the intervening layer 106 are etched, where the amount of intervening layer 106 remaining after the etch is inadequate to support a 2DEG in the III-N material layer 102. Thus, various combinations of etches and intervening layer 106 thickness may be utilized to form an enhancement mode or a depletion mode group III-N transistor. In an embodiment, gate opening 413 has a width, $W_G$, at the bottom of the opening that is approximately between 50 nm and 500 nm.

Figure 4J:
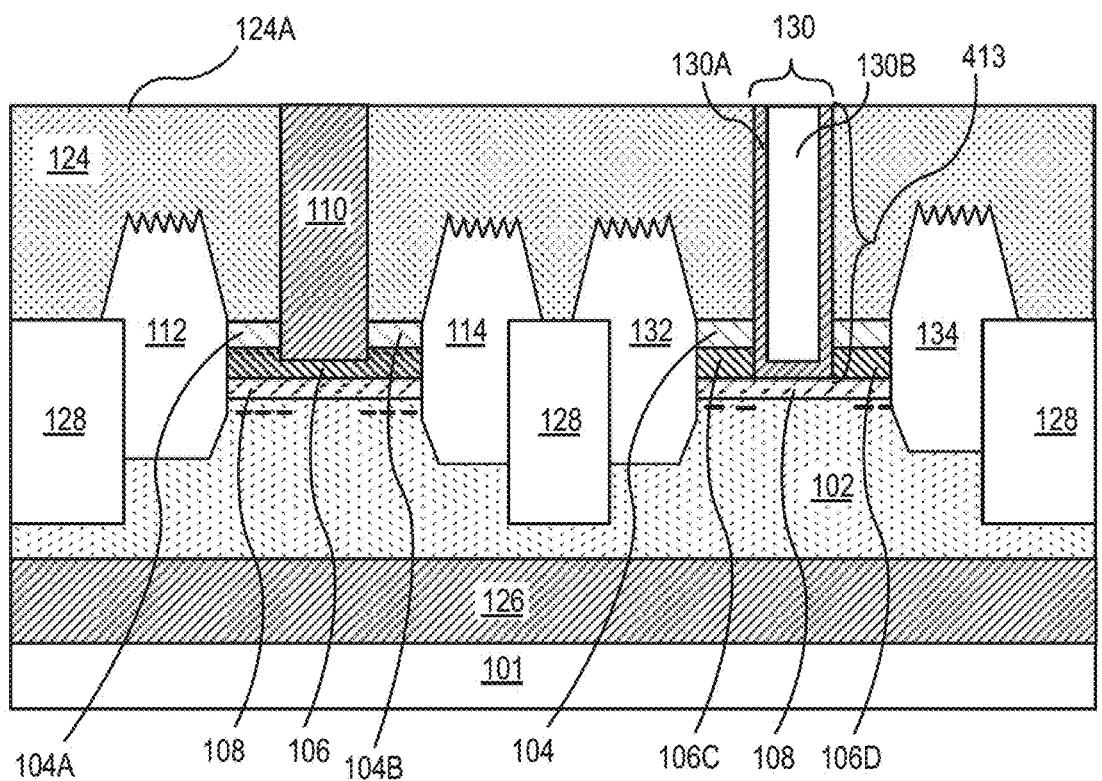
FIG. 4J illustrates the structure of FIG. 4I following the formation of a gate in the gate opening.

FIG. 4J illustrates the structure of FIG. 4I, following the formation of a gate structure 130 in the gate opening 413. In the illustrative embodiment, formation of the gate structure 130 includes blanket depositing a gate dielectric layer 130A on the mobility layer 108, on sidewalls of the polarization layers 104 and 106, and on the sidewalls of the dielectric material 124 in the terminal opening 413. In one embodiment, the gate dielectric layer 130A is also deposited on the top surface 124A of the dielectric material 124.

In an embodiment, the gate dielectric layer 130A, is formed by an atomic layer deposition (ALD) process or a PVD process. A gate electrode layer 130B is then deposited on the gate dielectric layer 130A in the terminal opening 409. In an embodiment, the gate electrode layer 130B includes a layer of a work function metal deposited in the gate opening 413 on the gate dielectric layer 130A and a gate cap layer deposited on the work function metal. In other the gate electrode layer 130B includes a layer of a work function metal deposited in the gate opening 413 on the gate dielectric layer 130A. After deposition of the gate dielectric layer 130A and the gate electrode layer 130B, a planarization process is performed to remove the gate dielectric layer 130A and the gate electrode layer 130B overburden from a top surfaces of the gate structure 130 and top surface 124A. In an embodiment, the planarization process includes a CMP process, where the CMP process forms a gate 130 having a top surface that is co-planar or substantially co-planar with the top surface 124A, as shown in the cross-sectional illustration of FIG. 4J.

In embodiments, where the intervening layer 106 has not been etched, the gate dielectric layer is deposited on the intervening layer 106. In further embodiments, where the intervening layer 106 is partially etched to form a recess (not shown), the gate dielectric layer 130A is deposited in the recess in the intervening layer 106. Depending on the amount of recess, width of opening 413, and the thickness of the gate dielectric layer 130A the gate electrode layer 130B may or may not be within the recess in the polarization layer 104.

Figure 4K:
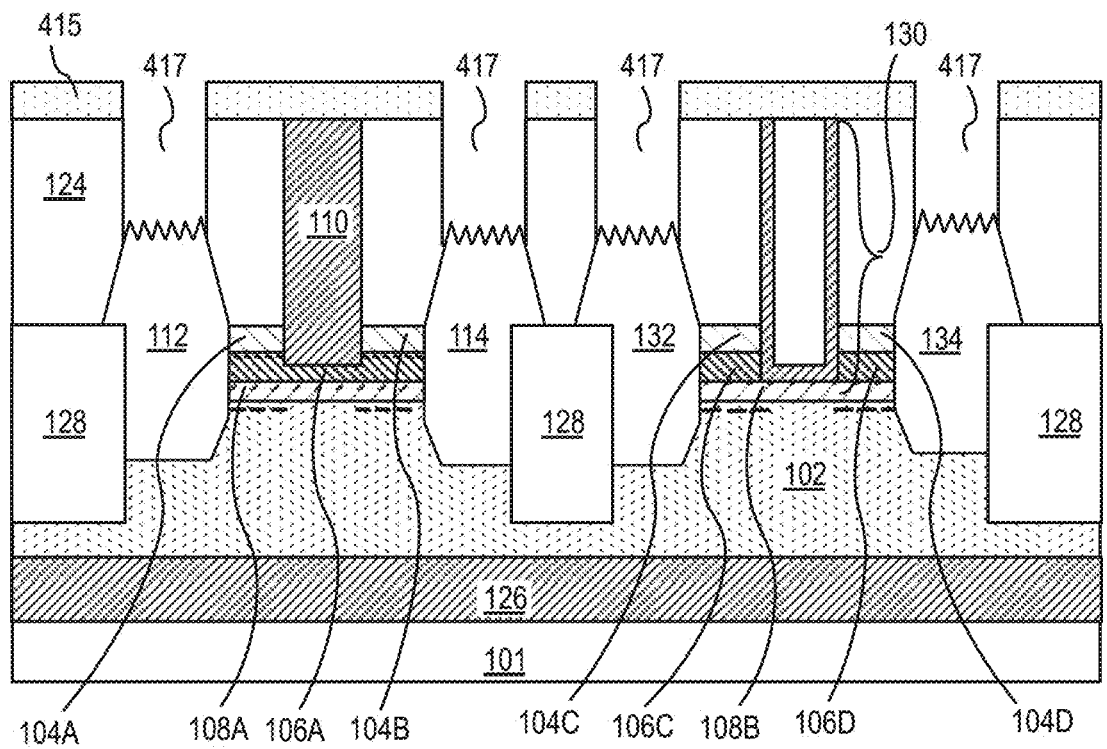
FIG. 4K illustrates the structure of FIG. 4J, following the formation of a contact opening in the dielectric material to expose each of the first, second, third and fourth raised structures.

FIG. 4K illustrates the structure of FIG. 4J following the formation the formation of a mask 415 over the dielectric material 124, on the terminal 110 and over the gate 130, and following the formation of a plurality of contact openings 417 in the dielectric material 124 to expose portions of each of the raised structures 112, 114, 132 and 134. In an embodiment, the mask 415 includes a same material as the material of the mask 415. The plurality of contact openings 417 may be formed, for example, by plasma etching the dielectric material 124 through openings in the mask 415.

Figure 4L:
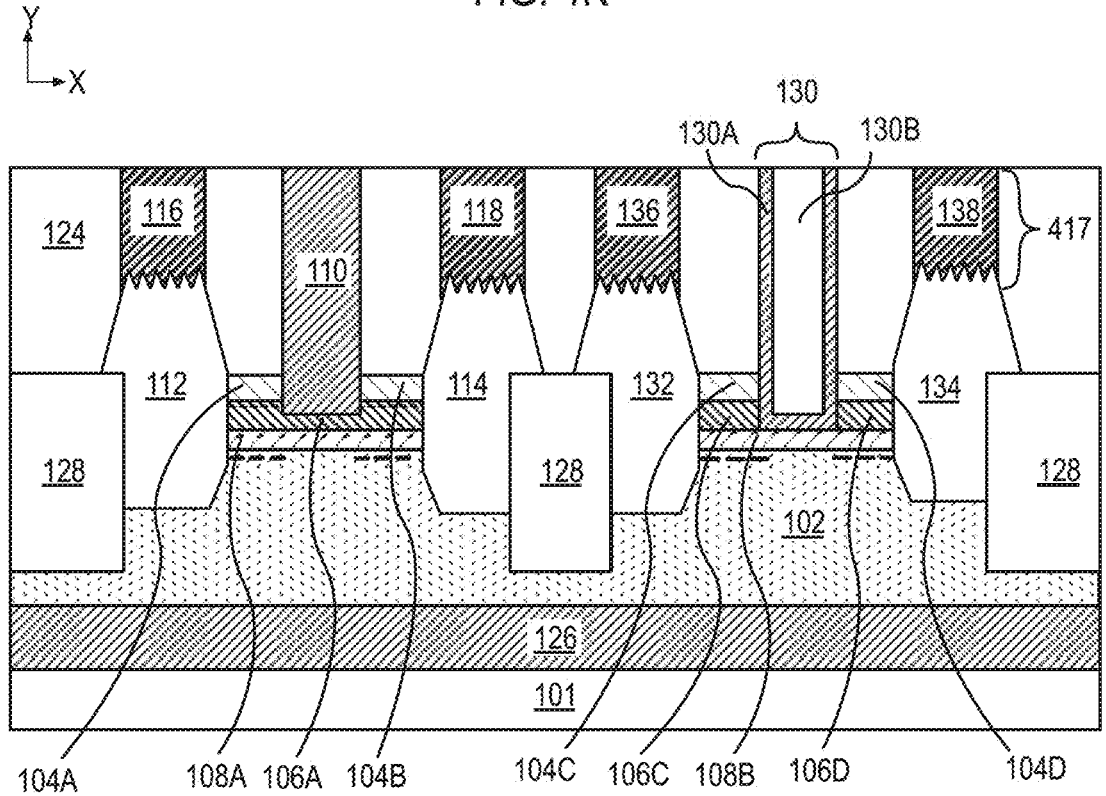
FIG. 4L illustrates the structure of FIG. 4K, following the formation of terminal contacts in the contact opening on each of the first, second, third and fourth raised structures.

FIG. 4L illustrates the structure of FIG. 4K following the formation of a contact terminal in each of the plurality of contact openings 417. In an embodiment, one or more layers of contact metal are deposited inside each of the plurality of contact openings 417 on exposed surfaces of the raised structures 112, 114, 132 and 134. For example, a liner material may be first deposited on the raised structures 112, 114, 132 and 134 and on sidewalls of the dielectric material 124 in the each of the plurality of contact openings 417. The liner material may include, for example, a metal such as ruthenium, titanium or tantalum or an alloy such as TiN or TaN. A fill metal such as tungsten, nickel, aluminum, copper, or cobalt may be blanket deposited on the liner material in each of the plurality of contact openings 417. The liner material and the fill metal may be deposited by a physical vapor deposition (PVD), plasma enhanced chemical vapor deposition (PECVD) or an atomic layer deposition (ALD) process. In an embodiment, the liner material is deposited to a thickness in the range of 5 nm and 10 nm, and the fill metal is deposited to fill the remaining portion of each of the plurality of contact openings 417.

A planarization process may be carried out to remove the liner material and the fill metal overburden from top surfaces of the contact terminals 116, 118, 136 and 138 and the top surface 124A. In one embodiment, the planarization process includes a CMP process. The CMP process leaves the liner material and the fill metal to form contact terminals 116, 118, 136 and 138 as shown in the cross-sectional illustration of FIG. 4J. In other embodiments, contact terminals 116, 118, 136 and 138 include only the fill metal.

Figure 5A:
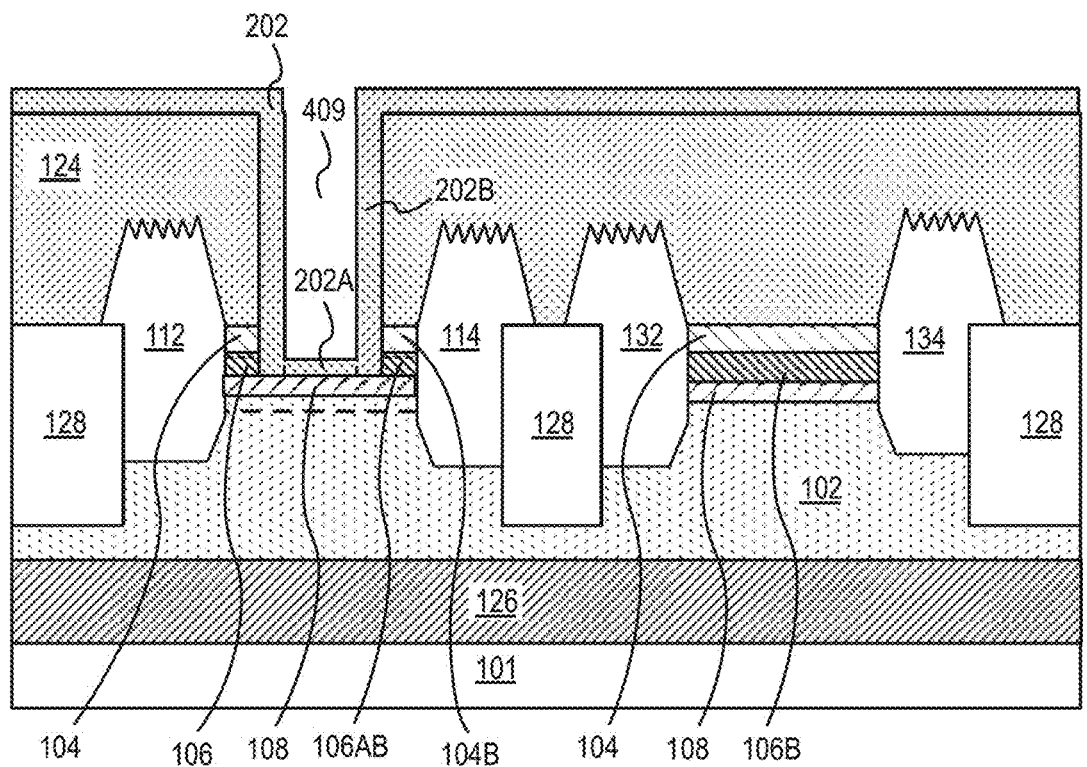
FIG. 5A illustrates the structure of FIG. 4G following the etching of the first polarization layer in the terminal opening and exposing an underlying mobility layer, and following the formation of a spacer layer in the opening on the mobility layer.
Figure 5B:
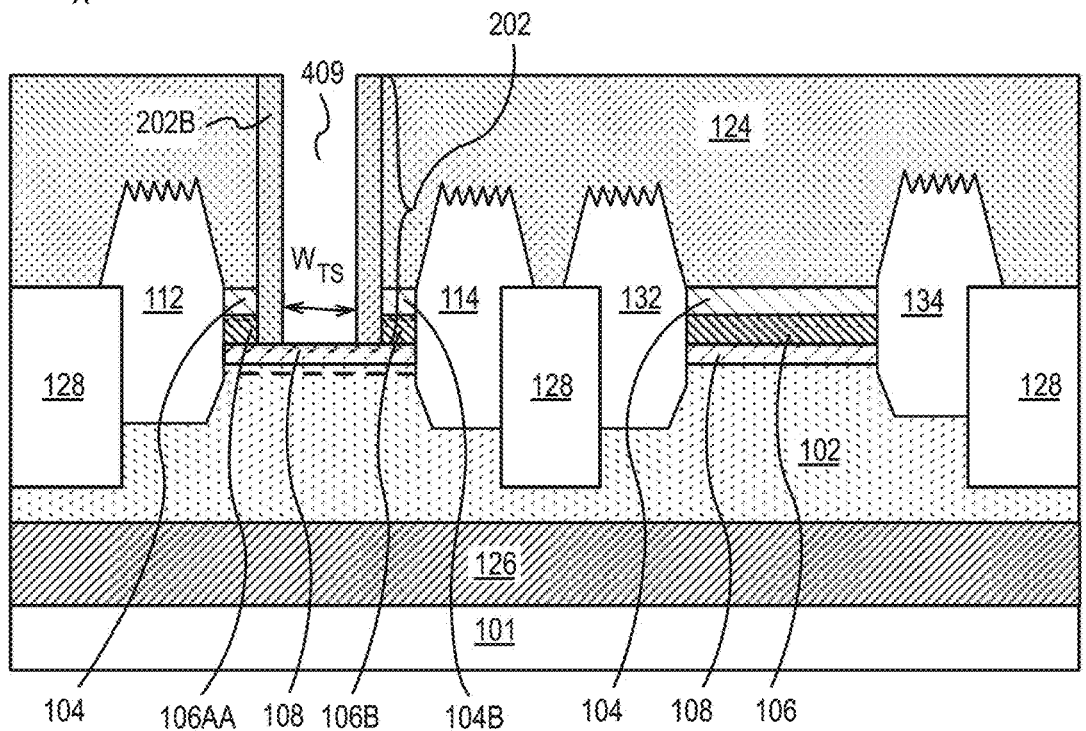
FIG. 5B illustrates the structure of FIG. 5A following the deposition of a spacer in the terminal opening on the mobility layer and on sidewalls of the dielectric layer, and following the etching of the spacer layer to form a spacer on sidewalls of the dielectric layer, where etching the spacer exposes the mobility layer.
Figure 5C:
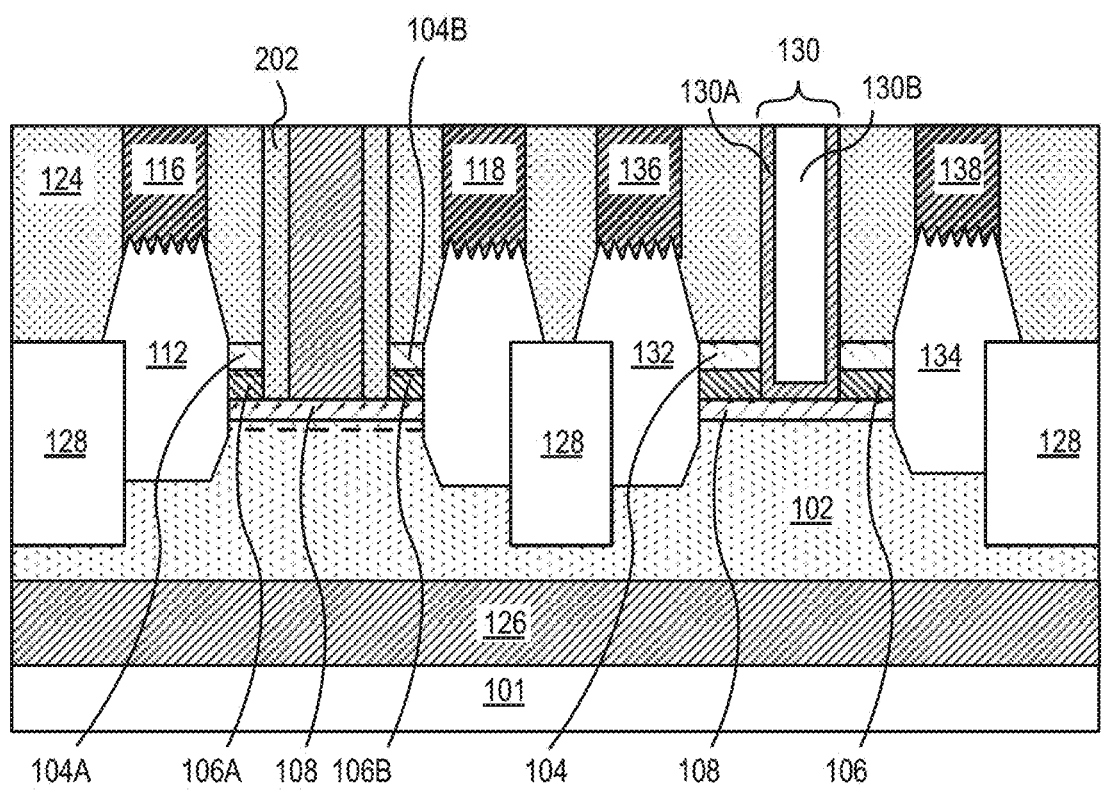
FIG. 5C illustrates the structure of FIG. 5B following the formation of a terminal in the terminal opening on the mobility layer adjacent to the spacer, formation of a gate and formation of a plurality of terminal contacts.

In some embodiments, the terminal 110 may be physically separated from one or more of the polarization layers 104, 106 by a spacer in between, such as is depicted in FIGS. 2A and 2B. FIGS. 5A-5C illustrate a method of fabricating a spacer adjacent to the terminal structure 110.

FIG. 5A illustrates the structure of FIG. 4G following a process to etch the intervening layer 106 to expose the mobility layer 108 and following the formation of a spacer layer 202 in the opening 409 on the mobility layer 108, on sidewalls of the polarization layers 104 and 106 and on sidewalls of the dielectric material 124. In an embodiment, the spacer layer 202 is blanket deposited and is also formed on the dielectric material 124. In an embodiment, the spacer layer 202 is deposited by using PECVD or a PVD process. As deposited the spacer layer 202 may or may not be conformal. For example, a lateral spacer portion 202A may be thicker than sidewall spacer portions 202B. The spacer layer 202 may have a thickness between 5 nm and 50 nm.

FIG. 5B illustrates the structure of FIG. 5A following the formation of a spacer 202. In an embodiment, a plasma etch is utilized to etch the spacer layer 202 to from spacer 202 on sidewalls of the polarization layers 104 and 106 and on sidewalls of the dielectric material 124. For example, etchants in the plasma may be directed vertically towards and etch (in the negative Y direction) the lateral spacer portion 202A from the mobility layer 108, forming the spacer 202 having sidewall portions 202B. In an embodiment, the sidewall spacer portions 202B may be thinned during the etch process. The opening formed by etching the spacer 202 has a width, Wm. The width, $W_{TS}$ may be enlarged by increasing the width of opening 409 to accommodate the thickness of the spacer 202. In some embodiments, the width, $W_{TS}$ increases with distance vertically away from the mobility layer 108.

In some embodiments, (not shown) the lateral spacer portion 202A may be masked so that the plasma etch can form an opening in the lateral spacer portion 202A to expose a portion of the mobility layer 108. In one such embodiment, the terminal 110 to be formed in the opening 409 has a profile such as is shown in the cross-sectional illustration of FIG. 2C.

FIG. 5C illustrates the structure of FIG. 5C following the formation of the terminal 110 and the gate 130 and contact terminals 116, 118, 136 and 138. In an embodiment, the materials and methods utilized to form the terminal 110 and the gate 130 are the same as the materials and methods utilized to form the terminal 110 and gate 130 as described above in association with FIGS. 4H to 4J. In an embodiment, the materials and methods utilized to form the contact terminals 116, 118, 136 and 138 are the same as the materials and methods utilized to form the contact terminals 116, 118, 136 and 138 described above in association with FIGS. 4K to 4L.

Figure 6A:
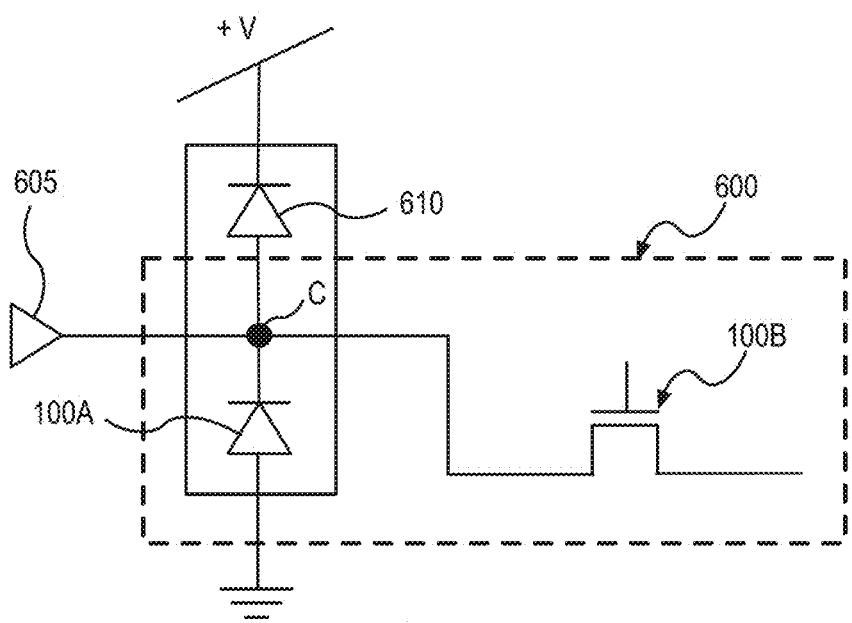
FIG. 6A illustrates a circuit layout having a diode connected between an electrostatic discharge (ESD) source and an ESD protected transistor.

FIG. 6A illustrates a circuit 600 demonstrating a diode 100A connected between a circuit element 605, a location of the ESD source, and a transistor structure 100B that is ESD protected. In an embodiment, a terminal of diode 100A is connected to a terminal of the transistor structure 100B in circuit (600). For example, a cathode terminal of diode 100A is connected to a drain terminal of the transistor structure 100B (point C). In an embodiment, the circuit element 605 is connected to the cathode of diode 100A (point C) and to the drain terminal of the transistor structure 100B. Diodes 100A offers a low resistance path during an ESD event as current can be diverted away from the transistor structure 100B under protection. In the illustrative embodiment, an external diode 610 is connected to the drain of the transistor structure 100B and cathode of the diode 100B (point C) as part of an external circuit.

Figure 6B:
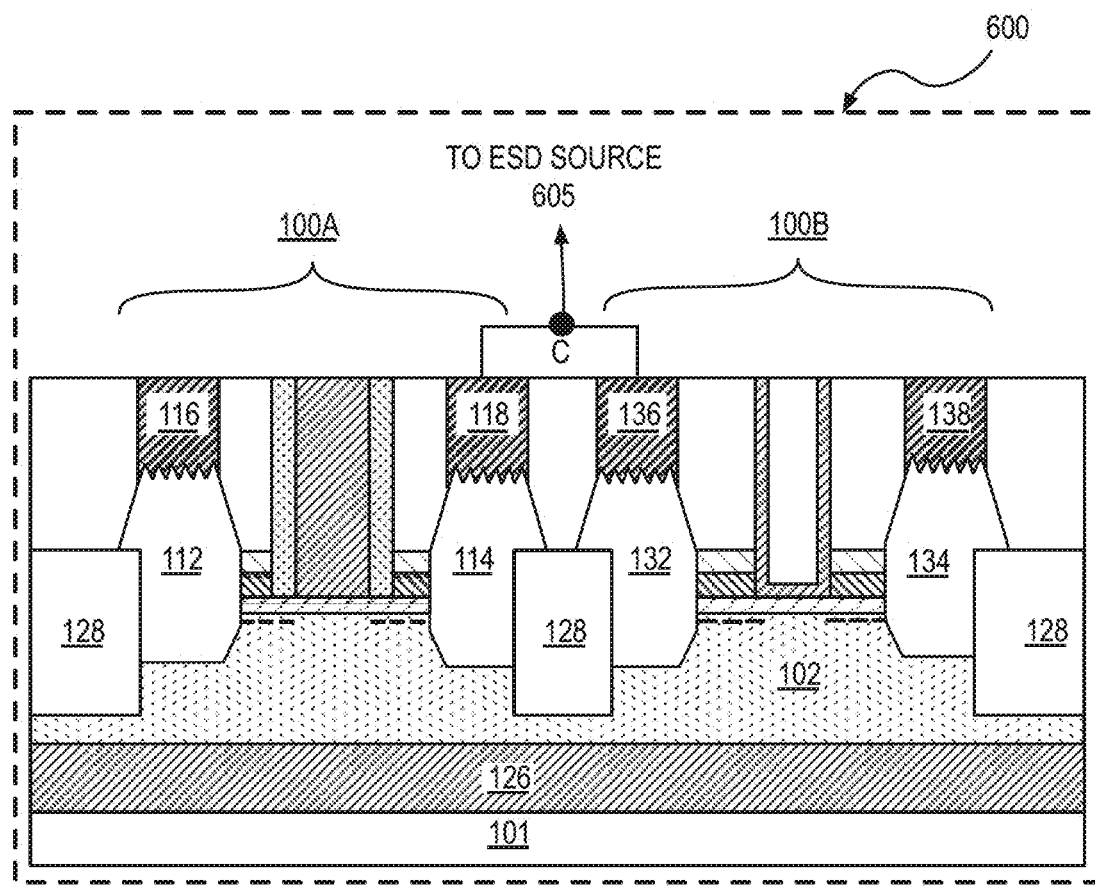
FIG. 6B is a cross section illustration of the diode and the transistor elements of the circuit depicted in FIG. 6A.

FIG. 6B is a cross section illustration of the diode 100A and the transistor structure 100B of the circuit 600 depicted in FIG. 6A. The terminal contact 118 of the diode 100A and the drain terminal 136 are connected at the circuit node C and also to the circuit element 605 (ESD source).

Figure 7:
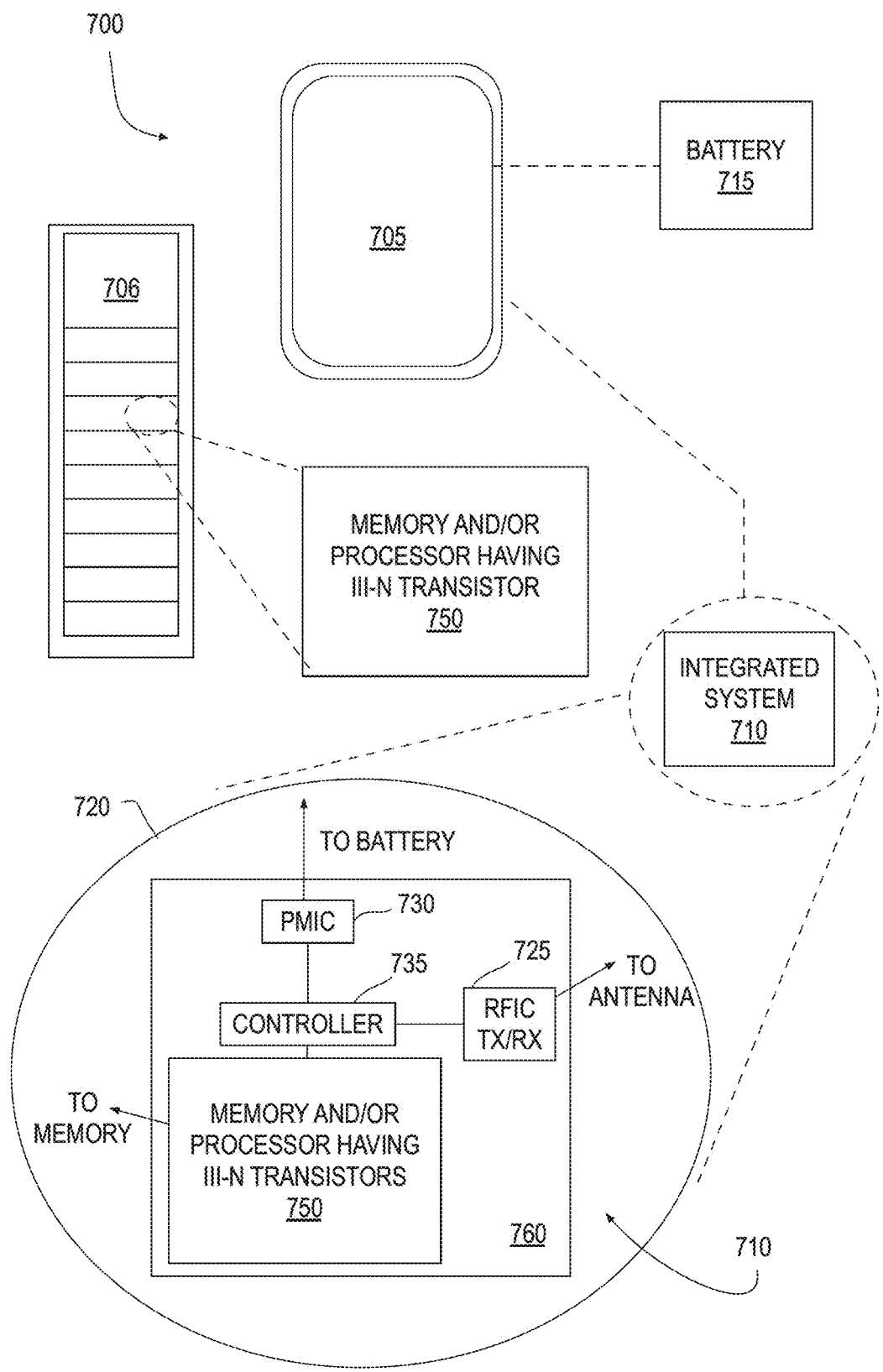
FIG. 7 is a functional block diagram of a group III-N SoC including group III-N transistor of a mobile computing platform, in accordance with an embodiment of the present disclosure.

FIG. 7 illustrates a system 700 in which a mobile computing platform 705 and/or a data server machine 706 employs an integrated circuit (IC) 750 including a device having a diode and a transistor, for example a diode 100A and a transistor structure 100B, such as is described in FIG. 1A. The server machine 706 may be any commercial server, for example including any number of high-performance computing platforms disposed within a rack and networked together for electronic data processing, which in the exemplary embodiment includes a packaged monolithic IC 750. The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), a chip-level or package-level integrated system 710, and a battery 715.

Whether disposed within the integrated system 710 illustrated in the expanded view 720, or as a stand-alone packaged chip within the server machine 706, packaged monolithic IC 750 includes a memory chip (e.g., RAM), or a processor chip (e.g., a microprocessor, a multi-core microprocessor, graphics processor, or the like) including at least one device system including a device 100 having a diode 100A and a transistor structure 100B for example, as described in FIG. 1A. The monolithic IC 750 may be further coupled to a board, a substrate, or an interposer 760 along with, one or more of a power management integrated circuit (PMIC) 730, RF (wireless) integrated circuit (RFIC) 725 including a wideband RF (wireless) transmitter and/or receiver (TX/RX) (e.g., including a digital baseband and an analog front-end module further comprises a power amplifier on a transmit path and a low noise amplifier on a receive path), and a controller thereof 735.

Functionally, PMIC 730 may perform battery power regulation, DC-to-DC conversion, etc., and so has an input coupled to battery 715 and with an output providing a current supply to other functional modules. As further illustrated, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.12 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 750 or within a single IC coupled to the package substrate of the monolithic IC 750.

Figure 8:
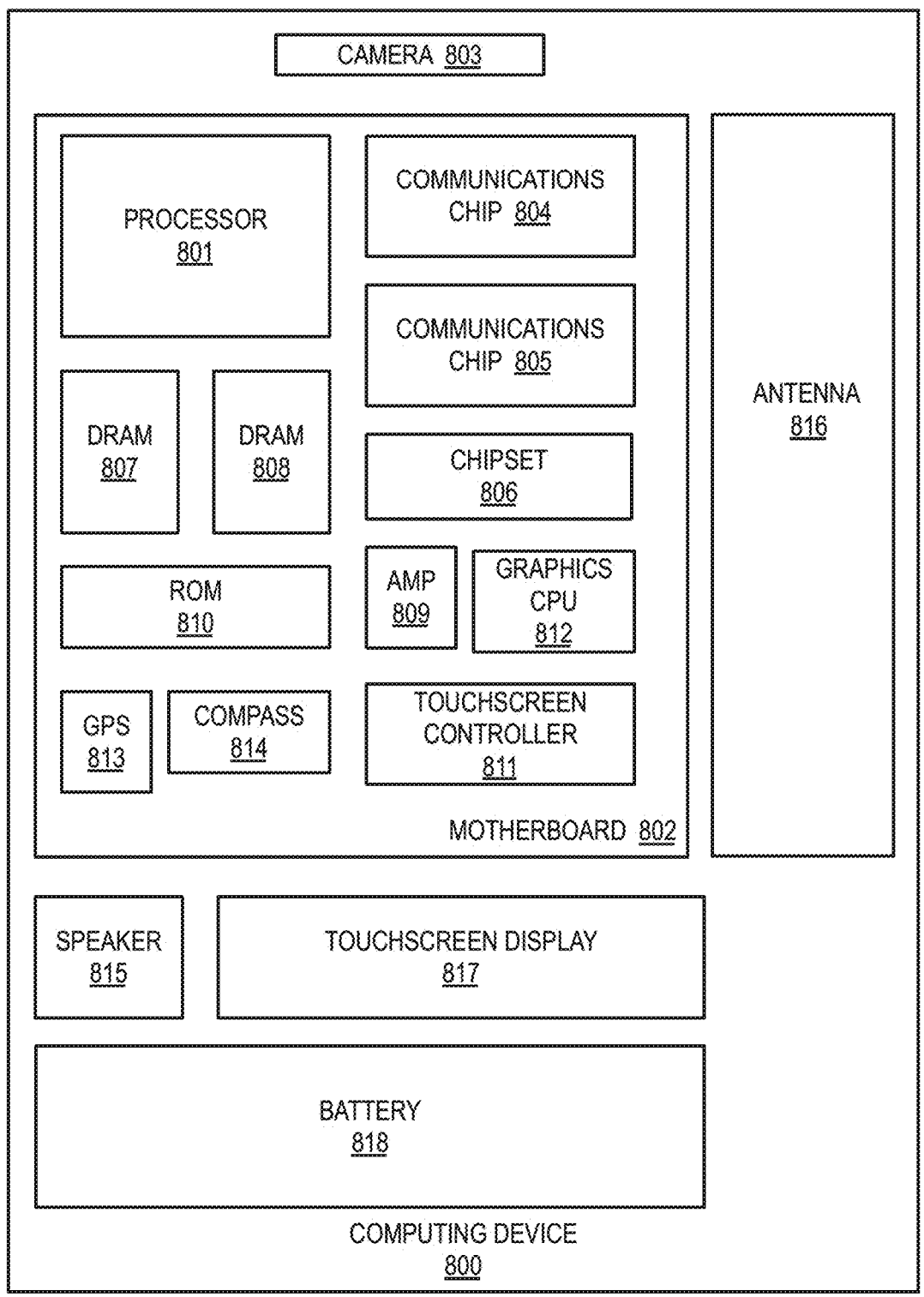
FIG. 8 illustrates a computing device in accordance with embodiments of the present disclosure.

FIG. 8 illustrates a computing device 800 in accordance with embodiments of the present disclosure. As shown, computing device 800 houses a motherboard 802. Motherboard 802 may include a number of components, including but not limited to a processor 801 and at least one communications chip 805. Processor 801 is physically and electrically coupled to the motherboard 802. In some implementations, communications chip 805 is also physically and electrically coupled to motherboard 802. In further implementations, communications chip 805 is part of processor 801.

Depending on its applications, computing device 800 may include other components that may or may not be physically and electrically coupled to motherboard 802. These other components include, but are not limited to, volatile memory (e.g., DRAM), non-volatile memory (e.g., ROM), flash memory, a graphics processor, a digital signal processor, a crypto processor, a chipset 806, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 805 enables wireless communications for the transfer of data to and from computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 805 may implement any of a number of wireless standards or protocols, including but not limited to Wi-Fi (IEEE 802.11 family), WiMAX (IEEE 802.12 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 800 may include a plurality of communications chips 804 and 805. For instance, a first communications chip 805 may be dedicated to shorter range wireless communications such as Wi-Fi and Bluetooth and a second communications chip 804 may be dedicated to longer range wireless communications such as GPS, EDGE, GPRS, CDMA, WiMAX, LTE, Ev-DO, and others.

Processor 801 of the computing device 800 includes an integrated circuit die packaged within processor 801. In some embodiments, the integrated circuit die of processor 801 includes a device 100 having a diode 100A and a transistor structure 100B. The term "processor" may refer to any device or portion of a device that processes electronic data from registers and/or memory to transform that electronic data into other electronic data that may be stored in registers and/or memory.

Communications chip 805 also includes an integrated circuit die packaged within communications chip 806. In another embodiment, the integrated circuit die of communications chip 805 includes a memory array with memory cells including a transistor such as transistor structure 100B and a diode 100A coupled to transistor structure 100B. The non-volatile memory device may include a magnetic tunnel junction (MTJ) device, a resistive random-access memory (RRAM) device or a conductive bridge random access memory (CBRAM) device.

In various examples, one or more communications chips 804, 805 may also be physically and/or electrically coupled to the motherboard 802. In further implementations, communications chips 804 may be part of processor 801. Depending on its applications, computing device 800 may include other components that may or may not be physically and electrically coupled to motherboard 802. These other components may include, but are not limited to, volatile memory (e.g., DRAM) 807, 808, non-volatile memory (e.g., ROM) 810, a graphics CPU 812, flash memory, global positioning system (GPS) device 813, compass 814, a chipset 806, an antenna 816, a power amplifier 809, a touchscreen controller 811, a touchscreen display 817, a speaker 815, a camera 803, and a battery 818, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 800 and discussed above may contain a stand-alone integrated circuit memory die that includes one or more arrays of device 100, 150, 200 and 250, built in accordance with embodiments of the present disclosure.

In various implementations, the computing device 800 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
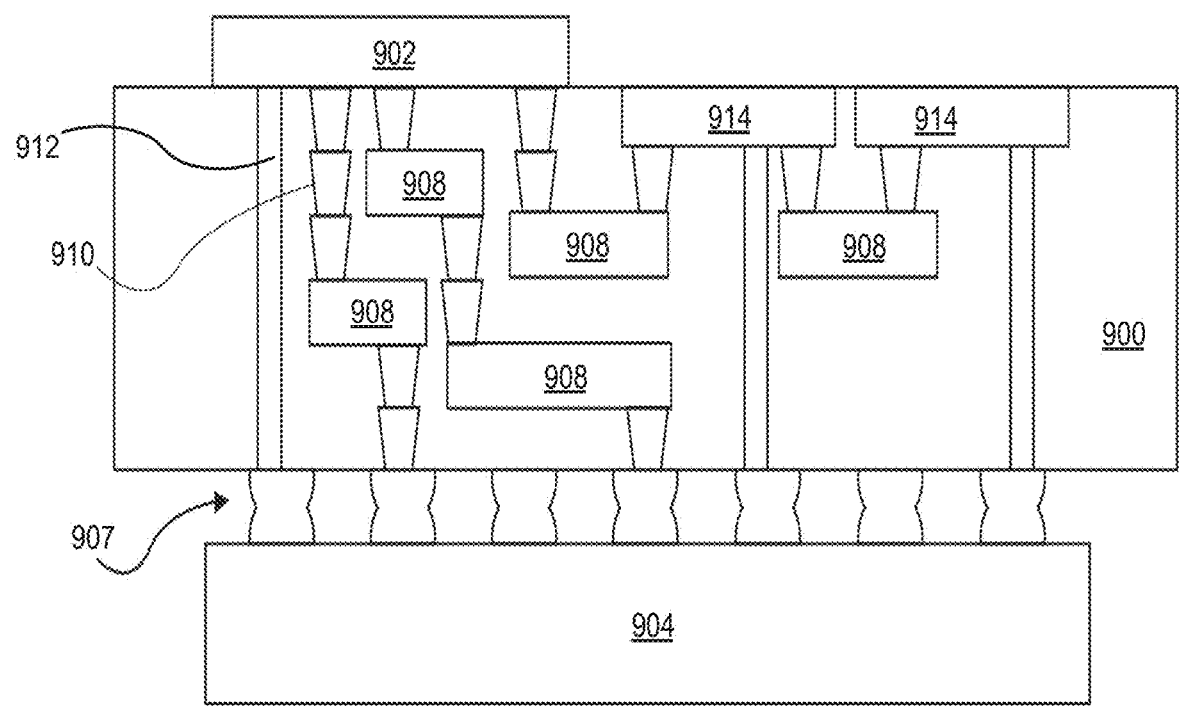
FIG. 9 illustrates an integrated circuit structure in accordance with embodiments of the present disclosure.

FIG. 9 illustrates an integrated circuit structure 900 that includes one or more embodiments of the disclosure. The integrated circuit (IC) structure 900 is an intervening structure used to bridge a first substrate 902 to a second substrate 904. The first substrate 902 may be, for instance, an integrated circuit die. The second substrate 904 may be, for instance, a memory module, a computer mother, or another integrated circuit die. The integrated circuit die may include one or more devices such as device 100 having a diode 100A and a transistor structure 100B, for example. Generally, the purpose of an integrated circuit (IC) structure 900 is to spread a connection to a wider pitch or to reroute a connection to a different connection. For example, an integrated circuit (IC) structure 900 may couple an integrated circuit die to a ball grid array (BGA) 907 that can subsequently be coupled to the second substrate 904. In some embodiments, the first and second substrates 902/904 are attached to opposing sides of the integrated circuit (IC) structure 900. In other embodiments, the first and second substrates 902/904 are attached to the same side of the integrated circuit (IC) structure 900. And in further embodiments, three or more substrates are interconnected by way of the integrated circuit (IC) structure 900.

The integrated circuit (IC) structure 900 may be formed of an epoxy resin, a fiberglass-reinforced epoxy resin, a ceramic material, or a polymer material such as polyimide. In further implementations, the integrated circuit (IC) structure 900 may be formed of alternate rigid or flexible materials that may include the same materials described above for use in a semiconductor substrate, such as silicon, germanium, and other group III-N, group III-V and group IV material.

The integrated circuit (IC) structure 900 may include metal interconnects 908 and via 910, including but not limited to through-silicon vias (TSVs) 912. The integrated circuit (IC) structure 900 may further include embedded devices 914, including both passive and active devices. Such devices include, but are not limited to, capacitors, decoupling capacitors, resistors, inductors, fuses, diodes, transformers, III-N transistors such as the transistor structure 100B adjacent to diode 100A, one or more magnetic tunnel junction or resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 900. In accordance with embodiments of the present disclosure, apparatuses or processes disclosed herein may be used in the fabrication of integrated circuit (IC) structure 900.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Thus, embodiments of the present disclosure include III-N devices including diodes and transistors and methods of fabrication. The following examples pertain to further embodiments.

In a first example, a device includes a diode. The diode includes a first group III-nitride (III-N) material, a second III-N material, a third III-N material between the second III-N material and the first III-N material, a first terminal including a metal in contact with the third III-N material, a second terminal coupled to the first terminal through the first group III-N material. The device further includes a transistor structure, adjacent to the diode structure. The transistor structure includes the first, second, and third III-N materials, a source and drain, a gate electrode and a gate dielectric between the gate electrode and each of the first, second and third III-N materials.

In second examples, for any of first example, the second III-N material includes more indium than the third III-N material.

In third examples, for any of the first through second examples, the third III-N material includes no indium.

In fourth examples, for any of the second examples, the second III-N material and the third III-N material includes Al, Ga, In and N, wherein the third III-N material includes less than 5 atomic percent indium and the second III-N material includes at least 15 atomic percent indium.

In fifth examples, for any of the first through fourth examples, the second III-N material includes more gallium than the third III-N material.

In sixth examples, for any of the first through fifth examples, the second III-N material has a thickness that is greater than a thickness of the third III-N material.

In seventh examples, for any of the first through sixth examples, the second III-N material has a thickness between 5 nm and 30 nm and the third III-N material has a thickness between 1 nm and 10 nm.

In eighth examples, for any of the first through seventh examples, the device further includes a fourth III-N material between the first III-N material and the third III-N material and wherein the first terminal is in contact with the fourth III-N material.

In ninth examples, for any of the eighth example, the fourth III-N material includes less gallium and more aluminum than the third III-N material.

In tenth examples, for any of the ninth examples, the fourth III-N material has a thickness between 1 nm and 3 nm.

In eleventh examples, for any of the first through tenth examples, the device further includes a spacer between a sidewall of the first terminal and a sidewall of the third III-N material and wherein the spacer includes silicon and at least one of oxygen or nitrogen.

In twelfth examples, for any of the first through eleventh examples, the device further includes a spacer on the third III-N material, and wherein the spacer is between a sidewall of the first terminal and a sidewall of the second III-N material.

In thirteenth examples, for any of the first through twelfth examples, the spacer further includes a lateral portion between a portion of the first terminal and a portion of the third III-N material.

In a fourteenth example, a method of fabricating a device includes forming a layer including a first group III-nitride (III-N) material above a substrate and forming a layer including a first group III-nitride (III-N) material above a substrate. The method further includes forming a layer including a second III-N material above the first layer. The method further includes forming a layer including a third III-N material above the second III-N material and forming a plurality of raised structures in the first III-N material. The method further includes forming first recess in the second III-N material and in a portion of the third III-N material between a first pair of raised structures and forming a terminal in the first recess. The method further includes forming a second recess in the second III-N material and in a portion of the third III-N material between a second pair of raised structures and forming a gate dielectric in the second recess. The method further includes forming a gate electrode on the gate dielectric layer.

In fifteenth examples, for any of the fourteenth example, forming the first opening further includes etching the second III-N material until a fourth III-N material under the second III-N material is exposed and forming the terminal on the fourth III-N material.

In sixteenth examples, for any of the fourteenth through fifteenth examples, the method further includes forming a spacer layer by depositing a dielectric layer in the first recess in the second III-N material and etching the spacer layer to expose a portion of the second III-N material in the first recess. The method further includes forming the terminal adjacent to the spacer, on the portion of the second III-N material exposed by etching the spacer layer.

In seventeenth examples, a system includes a processor and a radio transceiver coupled to the processor, where the transceiver includes a device. The device includes a diode structure where the diode includes a first group III-nitride (III-N) material, a second III-N material, a third III-N material between the second III-N material and the first III-N material, a first terminal including a metal in contact with the third III-N material, a second terminal coupled to the first terminal through the first group III-N material. The device further includes a transistor structure, adjacent to the diode structure. The transistor structure includes the first, second, and third III-N materials, a source and drain, a gate electrode and a gate dielectric between the gate electrode and each of the first, second and third III-N materials.

In a eighteenth example, for any of the seventeenth example, the second III-N material includes more indium than the third III-N material.

In a nineteenth example, for any of the eighteenth example, wherein the device further includes a fourth III-N material between the first III-N material and the third III-N material and wherein the first terminal is in contact with the fourth III-N material.

In a twentieth example, for any of the eighteenth through nineteenth example, the device further includes a spacer between a sidewall of the first terminal and a sidewall of the third III-N material and wherein the spacer comprises silicon and at least one of oxygen or nitrogen.

What is claimed is:

1. A device comprising:
   a diode structure comprising:
      a first group III-nitride (III-N) material;
      a second III-N material;
      a third III-N material between the first and second III-N materials, wherein the second III-N material comprises a greater indium concentration than the third III-N material;
      a first terminal comprising a metal, the first terminal in contact with the third III-N material; and
      a second terminal coupled to the first terminal through the first group III-N material; and
   a transistor structure adjacent to the diode structure, the transistor structure comprising:
      the first, second, and third III-N materials;
      a source and a drain;
      a gate electrode; and
      a gate dielectric between the gate electrode and each of the first, second, and third III-N materials.

2. The device of claim 1, wherein the second III-N material and the third III-N material each comprise Al, Ga, In and N, wherein the third III-N material comprises less than 5 atomic percent indium and the second III-N material comprises at least 15 atomic percent indium.

3. The device of claim 1, wherein the third III-N material is absent indium.

4. The device of claim 1, wherein the second III-N material has a thickness that is greater than a thickness of the third III-N material.

5. The device of claim 1, wherein the device further comprises a fourth III-N material between the first III-N material and the third III-N material.

6. The device of claim 5, wherein the fourth III-N material comprises a lower gallium concentration than the third III-N material.

7. The device of claim 1, wherein the device further comprises a spacer between a sidewall of the first terminal and a sidewall of the third III-N material, and wherein the spacer comprises silicon and at least one of oxygen or nitrogen.

8. The device of claim 1, wherein the device further comprises a spacer on the third III-N material, and wherein the spacer is between a sidewall of the first terminal and a sidewall of the second III-N material.

9. The device of claim 1, further comprising:
   a processor; and
   a radio transceiver coupled to the processor, wherein the radio transceiver comprises the diode structure and the transistor structure.

10. A device, comprising:
    a diode structure comprising:
       a first group III-nitride (III-N) material;
       a second III-N material;
       a third III-N material between the first and second III-N materials;
       a fourth III-N material between the first and third III-N materials, wherein the fourth III- N material comprises a lower gallium concentration and a greater aluminum concentration than the third III-N material;

a first terminal comprising a metal, the first terminal in contact with the third and fourth III-N material; and a second terminal coupled to the first terminal through the first group III-N material; and a transistor structure adjacent to the diode structure, the transistor structure comprising:

the first, second, third, and fourth III-N materials;

a source and a drain;

a gate electrode; and a gate dielectric between the gate electrode and each of the first, second, and third III-N materials.

11. The device of claim 10, wherein the second III-N material comprises a greater indium concentration than the third III-N material.

12. The device of claim 10, wherein the second III-N material has a thickness that is greater than a thickness of the third III-N material.

13. The device of claim 10, wherein the fourth III-N material comprises a lower gallium concentration and a greater aluminum concentration than the third III-N material.

14. The device of claim 10, wherein the fourth III-N material has a thickness between 1 nm and 3 nm.

15. The device of claim 10, further comprising:

a processor; and a radio transceiver coupled to the processor, wherein the radio transceiver comprises the diode structure and the transistor structure.

16. A device, comprising:

a diode structure comprising:

a first group III-nitride (III-N) material;

a second III-N material;

a third III-N material between the first and second III-N materials;

a first terminal comprising a metal, the first terminal in contact with the third III-N material;

a spacer on the third III-N material and between a sidewall of the first terminal and a sidewall of the second III-N material; and a second terminal coupled to the first terminal through the first group III-N material; and a transistor structure adjacent to the diode structure, the transistor structure comprising:

the first, second, and third III-N materials;

a source and a drain;

a gate electrode; and a gate dielectric between the gate electrode and each of the first, second, and third III-N materials.

17. The device of claim 16, wherein the second III-N material comprises a greater indium concentration than the third III-N material.

18. The device of claim 16, wherein the device further comprises a fourth III-N material between the first III-N material and the third III-N material, and wherein the first terminal is in contact with the fourth III-N material.

19. The device of claim 16, wherein the spacer further comprises a lateral portion between a portion of the first terminal and a portion of the third III-N material.

20. The device of claim 16, further comprising:

a processor; and a radio transceiver coupled to the processor, wherein the radio transceiver comprises the diode structure and the transistor structure.

* * * * *